(12) United States Patent
Choi et al.

(10) Patent No.: US 10,983,584 B2
(45) Date of Patent: Apr. 20, 2021

(54) ELECTRONIC DEVICE AND OPERATION METHOD THEREOF

(71) Applicant: SAMSUNG ELECTRONICS CO., LTD., Suwon-si (KR)

(72) Inventors: Wan-Soo Choi, Hwaseong-si (KR); Hyun Jin Choi, Suwon-si (KR); Jinwoo Kim, Seoul (KR); Yu-Hun Jun, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 128 days.

(21) Appl. No.: 16/439,159

(22) Filed: Jun. 12, 2019

(65) Prior Publication Data

US 2020/0150743 A1    May 14, 2020

(30) Foreign Application Priority Data

Nov. 12, 2018   (KR) ........................ 10-2018-0138097

(51) Int. Cl.
| | | |
|---|---|---|
| *G06F 1/32* | (2019.01) | |
| *G06F 1/3234* | (2019.01) | |
| *G06F 1/3287* | (2019.01) | |
| *G06F 1/3246* | (2019.01) | |
| *G11C 7/00* | (2006.01) | |

(52) U.S. Cl.
CPC .......... *G06F 1/3275* (2013.01); *G06F 1/3246* (2013.01); *G06F 1/3287* (2013.01); *G11C 7/00* (2013.01)

(58) Field of Classification Search
None
See application file for complete search history.

(56) References Cited

U.S. PATENT DOCUMENTS

| | | | | |
|---|---|---|---|---|
| 5,835,973 | A * | 11/1998 | Kyuma | ................. G06F 9/3013 711/220 |
| 7,472,293 | B2 | 12/2008 | Kuhlmann et al. | |
| 7,805,562 | B2 * | 9/2010 | Yada | ......................... G06F 8/60 711/103 |
| 8,024,591 | B2 | 9/2011 | Bertelsen et al. | |
| 8,117,367 | B2 | 2/2012 | Conti et al. | |
| 8,327,158 | B2 | 12/2012 | Titiano et al. | |
| 8,601,288 | B2 | 12/2013 | Brinks et al. | |
| 9,360,927 | B2 | 6/2016 | Herdrich et al. | |
| 9,904,563 | B2 | 2/2018 | Yiu et al. | |

(Continued)

*Primary Examiner* — Tan T. Nguyen
(74) *Attorney, Agent, or Firm* — F. Chau & Associates, LLC

(57) ABSTRACT

An operation method of an electronic device including a core includes reading first status information from a first status register of a first functional block driven independently of the core, reading second status information from a second status register of a second functional block driven independently of the core, reading first change information from a first flag register of the first functional block, reading second change information from a second flag register of the second functional block, determining whether an operation status of the electronic device is any one status of an idle status and a busy status, based on the read first and second status information and the read first and second change information, and operating in an operation mode corresponding to the determined operation status.

20 Claims, 22 Drawing Sheets

(56) References Cited

U.S. PATENT DOCUMENTS

| | | | | |
|---|---|---|---|---|
| 2002/0144053 | A1* | 10/2002 | Yada | G06F 8/60 |
| | | | | 711/103 |
| 2004/0264245 | A1* | 12/2004 | Matsubara | G11C 16/225 |
| | | | | 365/185.01 |
| 2008/0005454 | A1* | 1/2008 | Yada | G06F 8/60 |
| | | | | 711/103 |
| 2016/0219525 | A1 | 7/2016 | Kumar | |
| 2018/0227852 | A1 | 8/2018 | Wang et al. | |

* cited by examiner

[Busy Status]

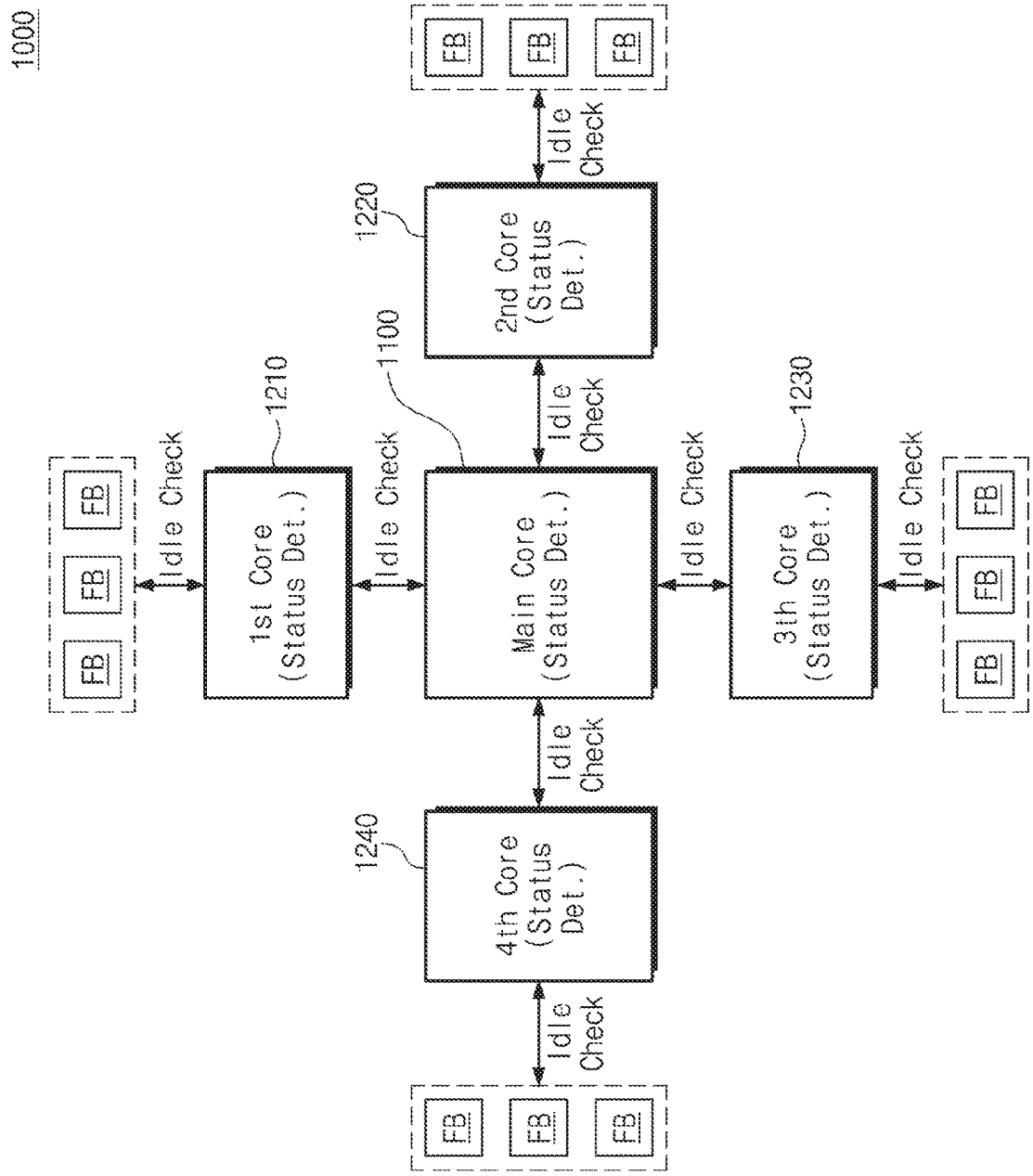

ELECTRONIC DEVICE AND OPERATION METHOD THEREOF

CROSS-REFERENCE TO RELATED APPLICATION

This application claims priority under 35 U.S.C. § 119 to Korean Patent Application No. 10-2018-0138097, filed on Nov. 12, 2018 in the Korean Intellectual Property Office, the disclosure of which is incorporated by reference herein in its entirety.

TECHNICAL FIELD

Exemplary embodiments of the inventive concept described herein relate to an electronic device, and more particularly, relate to an electronic device and an operation method thereof.

DISCUSSION OF RELATED ART

In general, computing systems such as smartphones, computers, notebooks, digital cameras, tablets, or various electronic devices included therein operate in various operating modes depending on an operation environment.

As one example, a solid state drive (SSD), which is widely used as a high-capacity storage medium, includes various electronic devices such as a plurality of flash memories, a buffer memory, and a controller. The SSD may operate in various operation modes depending on statuses of the electronic devices. For the SSD to operate in an intended operation mode, it may be important to determine statuses of various electronic devices. However, as functions of electronic devices are diversified, it may be difficult to determine a status of an electronic device accurately at a specific timing, and thus, devices such as the SSD may fail to operate in an accurate operation mode.

SUMMARY

According to an exemplary embodiment of the inventive concept, an operation method of an electronic device including a core includes reading first status information from a first status register of a first functional block driven independently of the core, reading second status information from a second status register of a second functional block driven independently of the core, reading first change information from a first flag register of the first functional block, reading second change information from a second flag register of the second functional block, determining whether an operation status of the electronic device is any one status of an idle status and a busy status, based on the read first and second status information and the read first and second change information, and operating in an operation mode corresponding to the determined operation status According to an exemplary embodiment of the inventive concept, an electronic device includes a core, and a plurality of functional blocks that operate independently of the core. Each of the plurality of functional blocks includes a logic circuit that performs a preset function, a status machine that detects an operation status of the logic circuit, a status register that stores status information corresponding to the operation status of the logic circuit, and a flag register that stores change information corresponding to a change in the operation status of the logic circuit. The core performs a status check operation for each of the plurality of functional blocks based on the status information of the status register and the change information of the flag register of a corresponding one of the plurality of functional blocks, performs a status change check operation for each of the plurality of functional blocks based on the change information of the flag register of the corresponding one of the plurality of functional blocks, after performing the status check operation, determines operation statuses of the plurality of functional blocks based on results of the status check operation and the status change check operation, and operates in an operation mode corresponding to the determined operation statuses among a plurality of operations modes.

According to an exemplary embodiment of the inventive concept, an operation method of an electronic device which includes a core and a plurality of functional blocks configured to be driven independently of the core includes performing a status check operation for each of the plurality of functional blocks, performing a status change check operation for each of the plurality of functional blocks, when a result of the status check operation indicates that the plurality of functional blocks are in an idle status, and determining an operation status of the electronic device as the idle status and operating in a corresponding operation mode, when a result of the status change check operation indicates that operation statuses of the plurality of functional blocks are not changed.

BRIEF DESCRIPTION OF THE FIGURES

The above and other objects and features of the inventive concept will become apparent by describing in detail exemplary embodiments thereof with reference to the accompanying drawings.

FIG. 14 is a block diagram illustrating an electronic device according to an exemplary embodiment of the inventive concept.

DETAILED DESCRIPTION OF THE EMBODIMENTS

Figure 1:
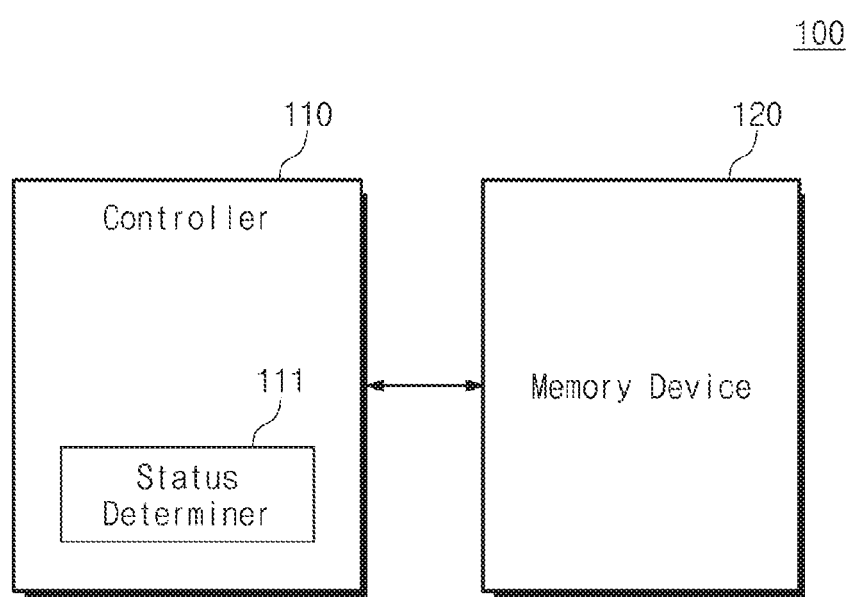
FIG. 1 is a block diagram illustrating a storage device according to an exemplary embodiment of the inventive concept.

Exemplary embodiments of the inventive concept provide an electronic device having improved reliability by accurately determining statuses of a plurality of functional blocks which are independently driven.

Below, exemplary embodiments of the inventive concept will be described in detail with reference to the accompanying drawings. Like reference numerals may refer to like elements throughout this application.

FIG. 1 is a block diagram illustrating a storage device according to an exemplary embodiment of the inventive concept. Below, for the sake of convenience, exemplary embodiments of the inventive concept will be described with respect to a storage device 100, but the inventive concept is not limited thereto. Software, hardware, or a combination thereof, according to exemplary embodiments of the inventive concept, may be applied to various electronic systems, computing systems, or electronic devices such as a storage device, a computer, a smartphone, or a digital camera.

Referring to FIG. 1, the storage device 100 may include a controller 110 and a memory device 120. The controller 110 may be configured to control the memory device 120. For example, the controller 110 may store data in the memory device 120 or may read data stored in the memory device 120.

Under control of the controller 110, the memory device 120 may store data or may output the stored data. In an exemplary embodiment of the inventive concept, the memory device 120 may include a volatile memory such as a static random access memory (SRAM) or a dynamic RAM (DRAM), or a nonvolatile memory such as a flash memory, a phase change RAM (PRAM), a magnetic RAM (MRAM), a resistive RAM (ReRAM), or a ferroelectric RAM (FRAM).

The controller 110 according to an exemplary embodiment of the inventive concept may provide various functions (e.g., a function of managing a mapping table, an error correction function, a randomizing function, or various operations executed by a processor) to control the memory device 120. The above-described functions may be performed by a functional block based on software, hardware, or a combination thereof, which is provided by the controller 110.

The controller 110 may operate in various operation modes based on statuses of functional blocks. For example, each of the functional blocks may have any one of a busy status and an idle status. The busy status may indicate a status in which a functional block performs a specific function or is communicating with any other functional block. The idle status may indicate a status in which a functional block does not perform an operation or communication. The controller 110 may determine statuses of the functional blocks (e.g., determine whether a functional block is in a busy status or in an idle status) to operate in an operation mode such as a power-off mode, a power saving mode, a reset mode, or an idle mode.

The controller 110 according to an exemplary embodiment of the inventive concept may include a status determiner 111. The status determiner 111 may be configured to determine statuses of various functional blocks provided in the controller 110. In an exemplary embodiment of the inventive concept, the status determiner 111 may be provided in the form of software driven by a main core of the controller 110 or in the form of separately provided hardware. A configuration of the status determiner 111 according to an exemplary embodiment of the inventive concept will be more fully described with reference to the accompanying drawings.

Figure 2:
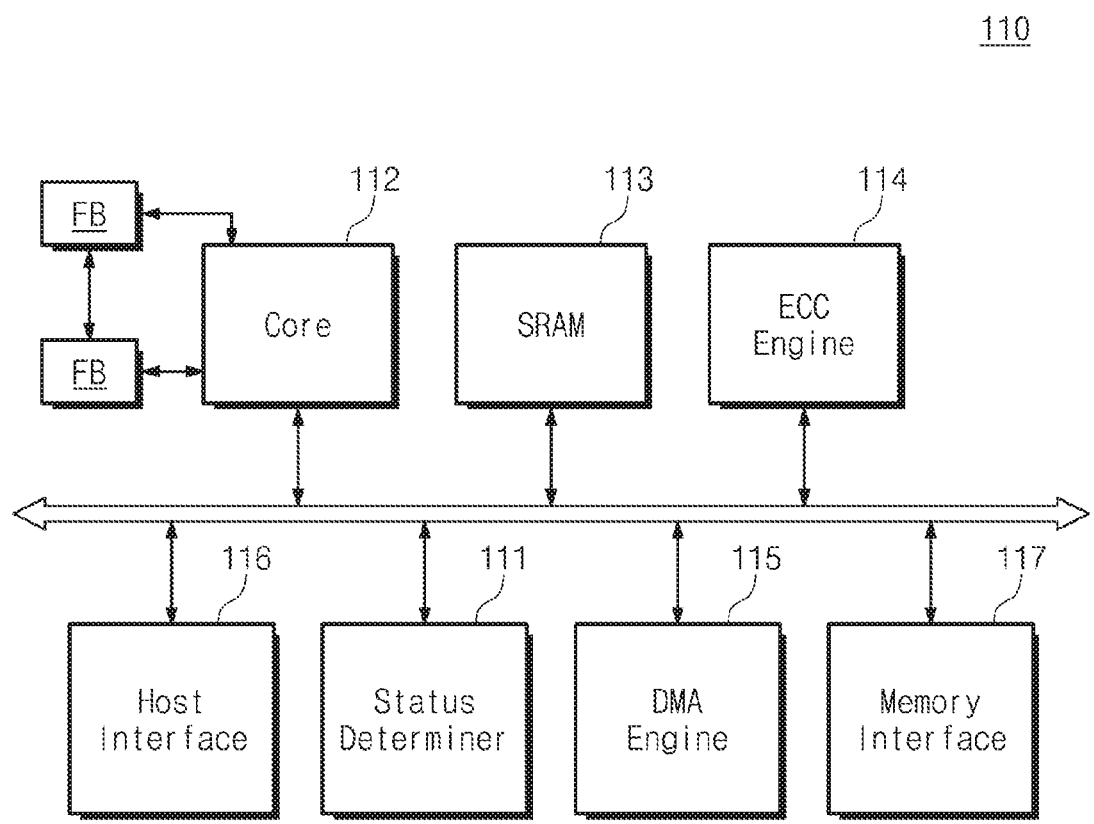
FIG. 2 is a block diagram illustrating a controller of FIG. 1 according to an exemplary embodiment of the inventive concept.

FIG. 2 is a block diagram illustrating a controller of FIG. 1 according to an exemplary embodiment of the inventive concept. Referring to FIG. 2, the controller 110 may include the status determiner 111, a core 112, an SRAM 113, an ECC engine 114, a DMA engine 115, a host interface 116, and a memory interface 117.

The core 112 may be configured to control overall operations of the controller 110. In an exemplary embodiment of the inventive concept, some of various functions (e.g., data processing, searching, and adding) to be performed by the core 112 may be performed by a functional block FB which is provided in the form of separate hardware. In other words, as some functions to be performed by the core 112 are performed by functional blocks FB implemented with separate hardware, a processing burden of the core 112 may be reduced, and the overall performance of the controller 110 may be improved.

In an exemplary embodiment of the inventive concept, the functional blocks FB may perform a specific function in response to a request from the core 112 or may perform the specific function independently without a request from the core 112. In the case where the functional blocks FB perform the specific function independently without a request from the core 112, the core 112 may fail to recognize statuses (e.g., a busy status and an idle status) of the functional blocks FB.

The status determiner 111 may be configured to determine statuses of the functional blocks FB. For example, the status determiner 111 may determine whether all the functional blocks FB are in the idle status at a particular time point. How the status determiner 111 determines a status will be more fully described below with reference to the drawings.

The SRAM 113 may be used as a buffer memory, a cache memory, or a main memory of the controller 110. In an exemplary embodiment of the inventive concept, the status determiner 111 may be implemented in the form of hardware, software, or a combination thereof. A program code or an instruction for the status determiner 111 implemented in the form of software may be stored in the SRAM 113, and information stored in the SRAM 113 may be executed by the core 112.

The ECC engine 114 may be configured to perform an operation of detecting and correcting an error of data read from the memory device 120. The DMA engine 115 may be configured to perform a direct memory access (DMA) operation between specific components (e.g., components included in the controller 110, the memory device 120, or an external device (e.g., a host)).

The controller 110 may be configured to communicate with an external device through the host interface 116. The controller 110 may communicate with the memory device 120 through the memory interface 117.

For convenience of description, exemplary embodiments in which the status determiner 111 determines statuses of the functional blocks FB operating independently without a request of the core 112 will be described below, but the inventive concept is not limited thereto. For example, the status determiner 111 may be configured to determine statuses of components (e.g., the SRAM 113, the ECC engine 114, the DMA engine 115, the host interface 116, or the memory interface 117) configured to perform a specific operation without a request or intervention of the core 112.

Figure 3:
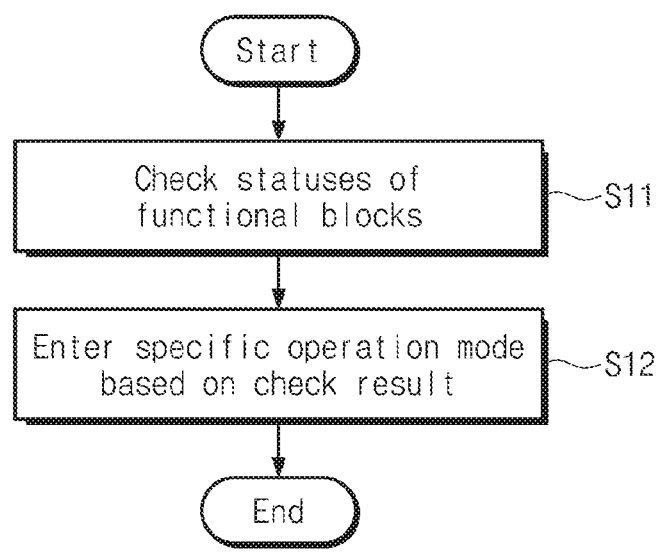
FIG. 3 is a flowchart illustrating an operation of a controller of FIG. 2 according to an exemplary embodiment of the inventive concept.
Figure 4A:
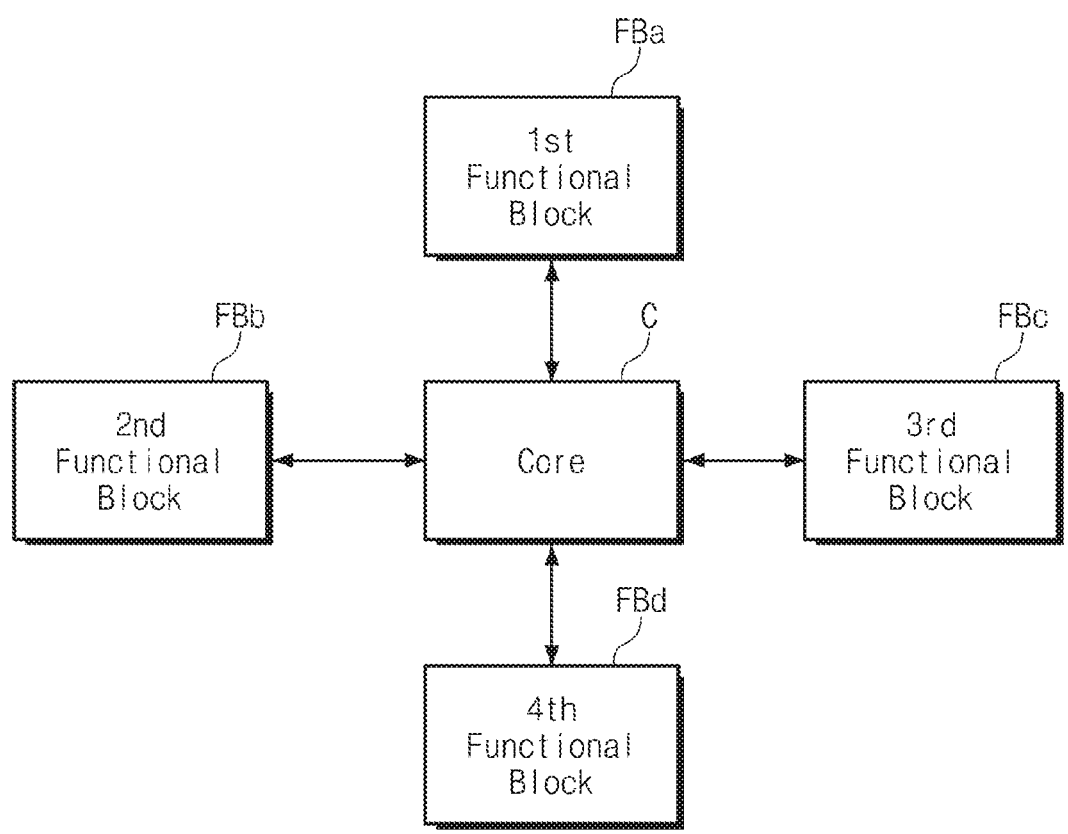
FIG. 4A is a diagram for describing an operation between a core and a functional block according to the related art.
Figure 4B:
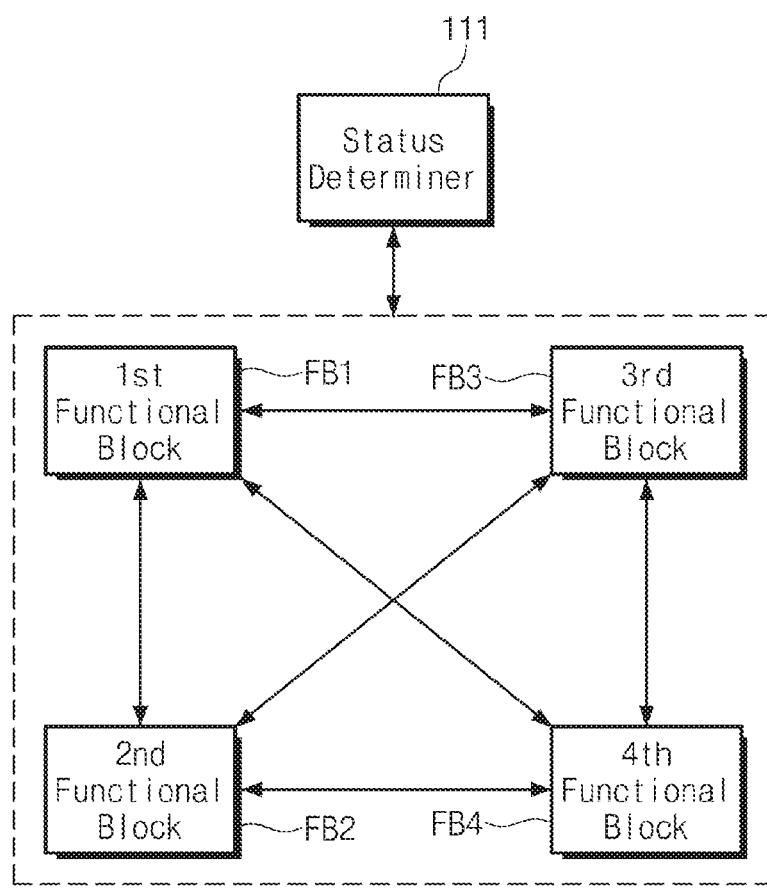
FIG. 4B is a diagram for describing operations of functional blocks and an operation of a status determiner, according to an exemplary embodiment of the inventive concept.

FIG. 3 is a flowchart illustrating an operation of a controller of FIG. 2 according to an exemplary embodiment of the inventive concept. FIG. 4A is a diagram for describing an operation between a core and a functional block according to the related art. FIG. 4B is a diagram for describing operations of functional blocks and an operation of a status determiner, according to an exemplary embodiment of the inventive concept.

Referring to FIGS. 2 and 3, in operation S11, the controller 110 may check statuses of functional blocks. For example, the status determiner 111 may checks a status of each of the functional blocks FB included in the controller 110.

In operation S12, the controller 110 may enter a specific operation mode, based on a check result. For example, in the case where statuses of all the functional blocks FB are in an idle status at a specific time point, the controller 110 may enter a specific operation mode such as a power-off mode, a power saving mode, a reset mode, or an idle mode.

In this case, it may be important to detect that all the functional blocks FB are in an idle status at a specific time point (e.g., at the same time point). As illustrated in FIG. 4A, in a configuration according to the related art, first to fourth functional blocks FBa to FBd may be configured to perform some functions of a core "C". In this case, the core "C" may directly control operations of the first to fourth functional blocks FBa to FBd. In other words, the core "C" may recognize a current status (e.g., a busy status or an idle status) of each of the first to fourth functional blocks FBa to FBd.

However, as illustrated in FIG. 4B, first to fourth functional blocks FB1 to FB4 according to an exemplary embodiment of the inventive concept may be configured to perform specific functions independently without a request or intervention of the core 112 or may be configured to communicate with one another independently. In this case, the core 112 may fail to detect statuses of the first to fourth functional blocks FB1 to FB4 at a specific time point. For example, to detect statuses of the first to fourth functional blocks FB1 to FB4, the core 112 may perform an operation for detecting statuses sequentially on the first to fourth functional blocks FB1 to FB4. A status of the first functional block FB1 may change to a busy status while performing an operation for detecting a status of the second functional block FB2, after it is detected that the status of the first functional block FB1 is in the idle status. In other words, since a status of each of the first to fourth functional blocks FB1 to FB4 is changed during a sequential operation for detecting statuses, the core 112 may fail to detect all statuses of the first to fourth functional blocks FB1 to FB4 at a specific time point (e.g., at the same time point).

The status determiner 111 according to an exemplary embodiment of the inventive concept may perform a status detecting operation capable of determining that all the first to fourth functional blocks FB1 to FB4 are in the idle status at a specific time point. An operation of the status determiner 111 according to an exemplary embodiment of the inventive concept will be more fully described below with reference to the drawings.

Figure 5:
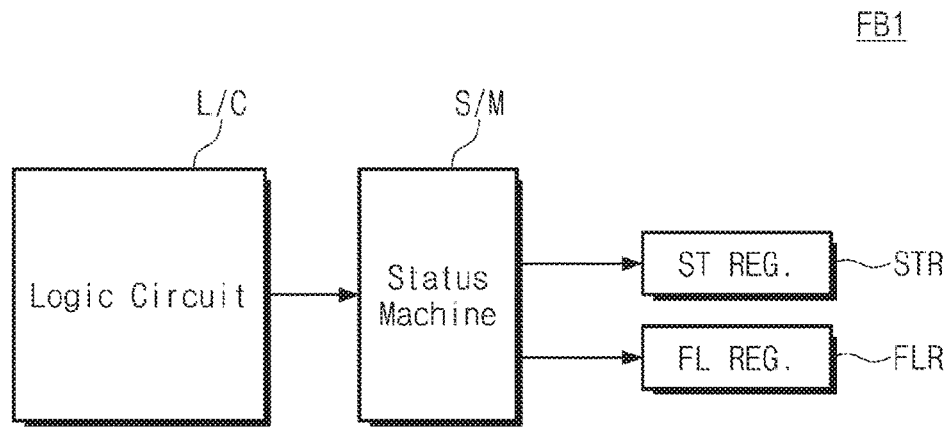
FIG. 5 is a block diagram illustrating a first functional block of FIG. 4B according to an exemplary embodiment of the inventive concept.
Figure 6:
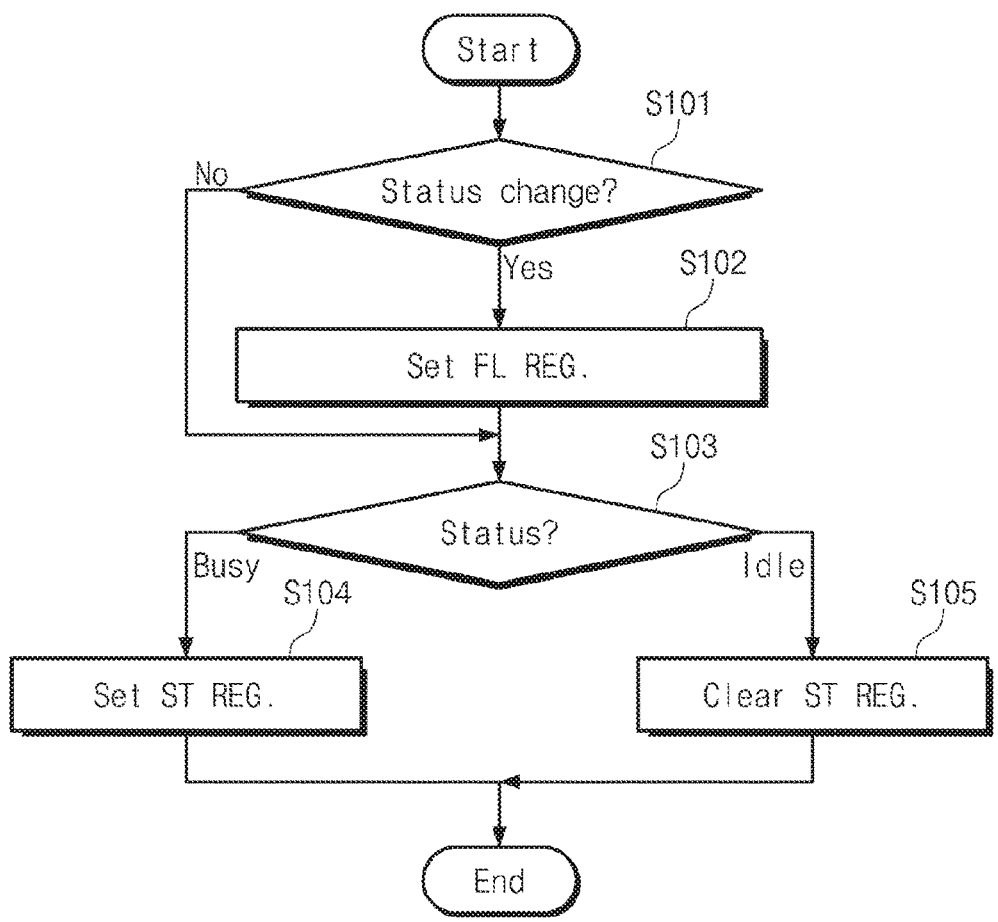
FIG. 6 is a flowchart illustrating an operation of the first functional block of FIG. 5 according to an exemplary embodiment of the inventive concept.

FIG. 5 is a block diagram illustrating a first functional block of FIG. 4B according to an exemplary embodiment of the inventive concept. FIG. 6 is a flowchart illustrating an operation of the first functional block of FIG. 5 according to an exemplary embodiment of the inventive concept. The first functional block FB1 will be described with reference to FIGS. 5 and 6, but other functional blocks may have similar structures or may operate based on similar methods.

Referring to FIGS. 2, 5, and 6, the first functional block FB1 may include a logic circuit L/C, a status machine S/M, a status register STR, and a flag register FLR. The logic circuit L/C may be a hardware component configured to perform a specific function of various functions to be performed by the core 112.

The status machine S/M may determine whether the logic circuit L/C is performing a specific function. In the case where the logic circuit L/C is performing the specific function, the status machine S/M may determine that the first functional block FB1 is in the busy status; in the case where the logic circuit L/C does not perform the specific function, the status machine S/M may determine that the first functional block FB1 is in the idle status.

The status machine S/M may set a value of the status register STR or the flag register FLR based on the determined status (e.g., the busy status or the idle status). For example, as illustrated in FIG. 6, in operation S101, the status machine S/M of the first functional block FB1 may determine whether a status is changed.

In the case where the status of the first functional block FB1 is changed (e.g., in the case where a status changes from the idle status to the busy status or changes from the busy status to the idle status), in operation S102, the status machine S/M may set the flag register FLR. The value of the flag register FLR corresponding to a "SET" state may indicate that a status of the first functional block FB1 is changed (e.g., is changed from/to the idle status to/from the busy status).

In operation S103, the status machine S/M may determine a status of the first functional block FB1. In the case where the determined status is the busy status, in operation S104, the status machine S/M may set the status register STR. In the case where the determined status is the idle status, in operation S105, the status machine S/M may clear the status register STR. In other words, the value of the status register STR corresponding to a "SET" state may indicate that the first functional block FB1 is in the busy status, and the value of the status register STR corresponding to a "CLEAR" state may indicate that the first functional block FB1 is in the idle status.

As described above, values of the flag register FLR and the status register STR may be adjusted based on whether a status of the first functional block FB1 is changed and a current status of the first function block FB1. In an exemplary embodiment of the inventive concept, the status register STR may have status information indicating a status of the first functional block FB1, and the flag register FLR may have change information indicating whether a status of the first functional block FB1 is changed.

Figure 7A:
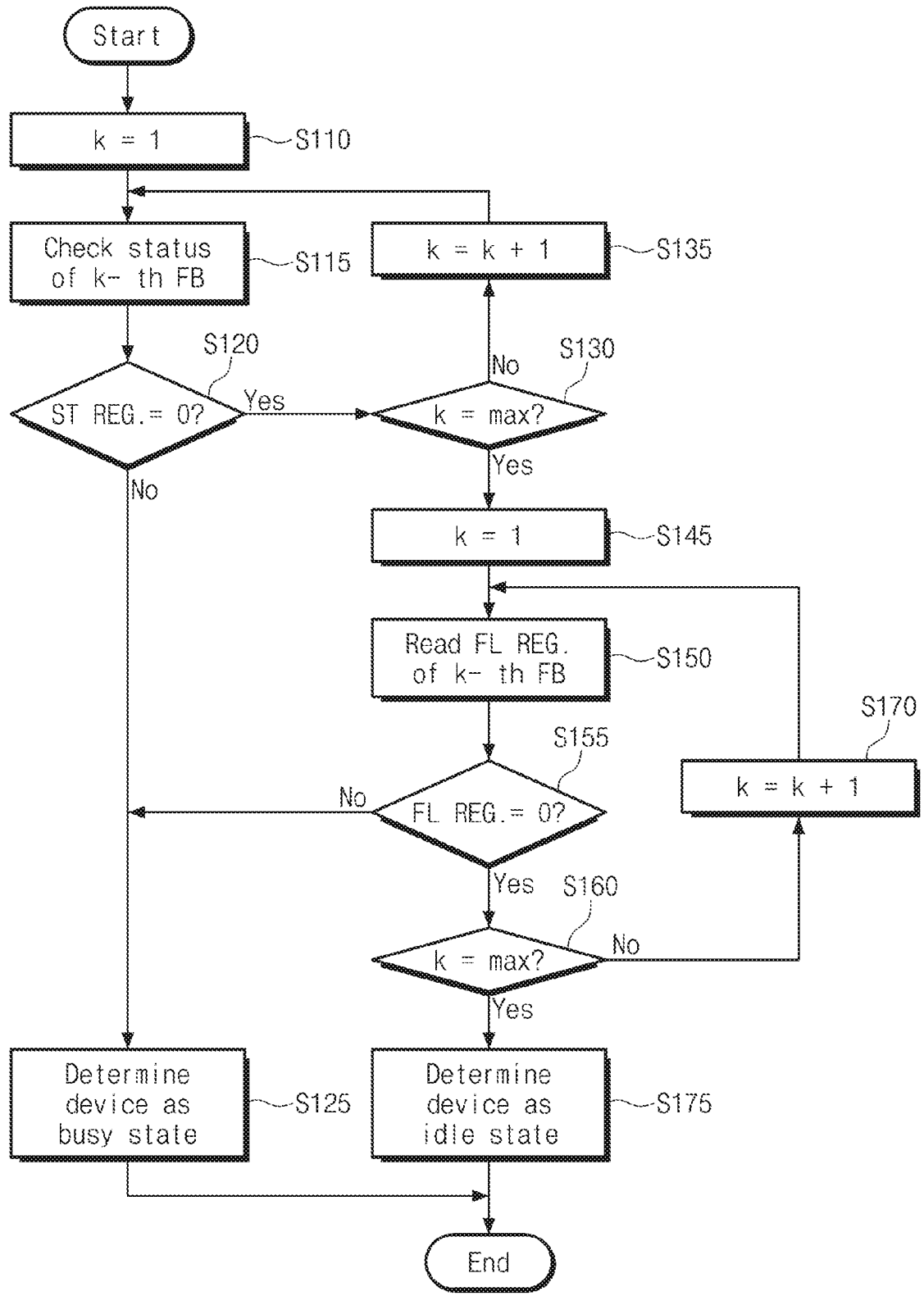
FIGS. 7A and 7B are flowcharts illustrating an operation of a status determiner of FIG. 2 according to an exemplary embodiment of the inventive concept.
Figure 7B:
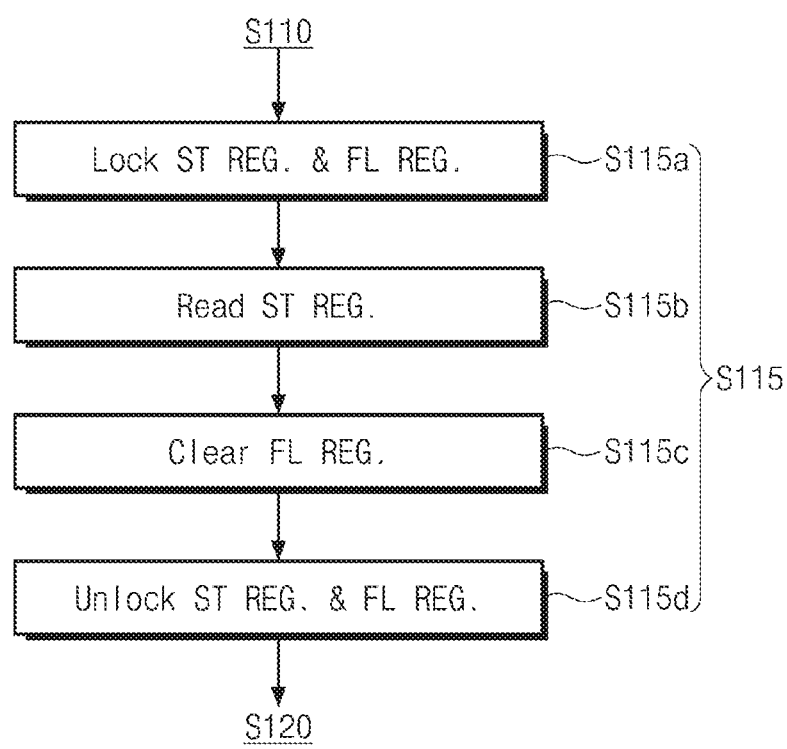

FIGS. 7A and 7B are flowcharts illustrating an operation of a status determiner of FIG. 2 according to an exemplary embodiment of the inventive concept. For convenience of description, components which are unnecessary to describe exemplary embodiments of the inventive concept are omitted. Below, exemplary embodiments of the inventive concept will be described based on an operation of the status determiner 111, but the inventive concept is not limited thereto. For example, exemplary embodiments of the inventive concept may be implemented with a separate hardware component(s) or with a core (e.g., the core 112 of FIG. 2) configured to drive the status determiner 111.

Below, a description will be given assuming that the status determiner 111 directly controls the status register STR and the flag register FLR included in each of a plurality of functional blocks (e.g., the status determiner 111 controls an operation of directly reading or clearing the status register STR and the flag register FLR included therein), but the inventive concept is not limited thereto. For example, the status determiner 111 may provide a specific command for controlling the status register STR and the flag register FLR to each of the plurality of functional blocks, and the status machine S/M included in each of the plurality of functional blocks may control the status register STR and the flag register FLR in response to the received specific command.

Below, for convenience of description, it is assumed that the status register STR and the flag register FLR have any one of "bit 0" (hereinafter briefly referred to as "0") and "bit 1" (hereinafter briefly referred to as "1") depending on a setting state. For example, it is assumed that the status register STR and the flag register FLR have a value of "1" when the status register STR and the flag register FLR are "SET", and have a value of "0" when the status register STR and the flag register FLR are "CLEARED" However, the inventive concept is not limited thereto. For example, the status register STR and the flag register FLR may have various bit values or various bit codes depending on a setting state.

Referring to FIGS. 2, 5, 7A, and 7B, in operation S110, a variable "k" may be set to "1". The variable "k" is used only to describe an iterative operation according to an exemplary embodiment of the inventive concept, and is not intended to limit the scope and spirit of the inventive concept.

In operation S115, the status determiner 111 may check a status of a k-th functional block. For example, as illustrated in FIG. 7B, the status determiner 111 may perform operation S115a to operation S115d to check the status of the k-th functional block.

In operation S115a, the status determiner 111 may lock the status register STR and the flag register FLR of the k-th functional block. In operation S115b, the status register STR may read a value of the status register STR of the k-th functional block. In operation S115c, the status determiner 111 may "clear" the value of the flag register FLR. In operation S115d, the status determiner 111 may unlock the status register STR and the flag register FLR of the k-th functional block.

In an exemplary embodiment of the inventive concept, "locking" and "unlocking" the status register STR and the flag register FLR may be performed to prevent a value of the status register STR or the flag register FLR from being changed by a value of any other components (e.g., the status machine S/M) while the status determiner 111 checks a status of the k-th functional block. In other words, "locking" and "unlocking" the status register STR and the flag register FLR may be performed to ensure that operation S115 of the status determiner 111 is atomically performed. To operate atomically or an atomic operation means that specific operations are performed continuously and sequentially and any other operation is not performed between the specific operations.

For example, while the status of the k-th functional block is checked, the status of the k-th functional block may be changed (e.g., changed from the idle status to the busy status). In the case where the status register STR and the flag register FLR are not locked/unlocked, a status register (STR) reading operation and a flag register (FLR) clearing operation by the status determiner 111 may collide with a status register (STR) set operation or a flag register (FLR) set operation by the status machine (S/M). To prevent the collision, the status determiner 111 may lock/unlock the status register STR and the flag register FLR.

In an exemplary embodiment of the inventive concept, in the case where the status of the k-th functional block is changed while the status determiner 111 checks the status of the k-th functional block, the k-th functional block may set the status register STR and the flag register FLR to a relevant value after the status determiner 111 completely checks the status of the k-th functional block (e.g., after operation S115 or after operation S115d).

In operation S120, the status determiner 111 may determine whether the read value of the status register STR is "0". When the value of the status register STR is not "0" (e.g., the case where the value of the status register STR is "1"), the status of the k-th functional block is the busy status. In this case, in operation S125, the status determiner 111 determines that a device (e.g., the controller 110) is in the busy status.

When the value of the status register STR is "0", the status of the k-th functional block is the idle status. In this case, in operation S130, the status determiner 111 may determine whether the variable "k" is a maximum value. In other words, the status determiner 111 may determine whether statuses of all functional blocks are checked.

In the case where the variable "k" is not a maximum value (e.g., in the case where a functional block to be checked exists), the variable "k" may increase as much as "1" in operation S135, and the status determiner 111 performs operation S115 again.

As described above, the status determiner 111 may perform operation S115 to operation S135 to check that all the functional blocks are in the idle status.

Afterwards, in operation S145, the variable "k" is set to "1". In operation S150, the status determiner 111 may read the flag register FLR of the k-th functional block.

In operation S155, the status determiner 111 may determine whether the read value of the flag register FLR is "0". Since the flag register FLR is cleared in the status check operation performed in operation S115, that the value of the flag register FLR read in operation S150 is not "0" (e.g., is "1") may indicate that a status of the k-th functional block is changed. In other words, that the value of the flag register FLR read in operation S150 is not "0" (e.g., is "1") may indicate that the status of the k-th functional block is changed from the idle status to the busy status after the status check operation of the status determiner 111. In this case, in operation S125, the status determiner 111 may determine whether a device is in the busy status.

That the value of the flag register FLR read in operation S150 is "0" may indicate that the status of the k-th functional block is not changed after the status check operation of the status determiner 111. In other words, that the value of the flag register FLR is "0" may indicate that the k-th functional block maintains the idle status after the status check operation of the status determiner 111. In this case, in operation S160, it is determined whether the variable "k" is a maximum value; when the variable "k" is not a maximum value, in operation S170, the variable "k" increases as much as "1". Afterwards, the flow proceeds back to operation S150. The status determiner 111 may perform operation S150 to operation S170 to perform a status change check operation on all the functional blocks.

When the variable "k" is the maximum value, in operation S175, the status determiner 111 may determine that a device is in the idle status. For example, the status determiner 111 may perform operation S115 to operation S135 (e.g., the status check operation) to determine that statuses of all the functional blocks are the idle status. Afterwards, the status determiner 111 may perform operation S150 to operation S170 (e.g., the status change check operation) to determine that a history associated with a status change does not exist, after the status check operation is performed on all the functional blocks.

In other words, the status determiner 111 may determine that all the functional blocks are in the idle status at a specific time point, by performing the status check operation and the status change check operation for each of all the functional blocks.

FIGS. 8A to 10B are diagrams for describing a status determining operation according to exemplary embodiments of the inventive concept. For convenience of description, exemplary embodiments of the inventive concept will be described with respect to a status determining operation associated with the first to fourth functional blocks FB1 to FB4. The first to fourth functional blocks FB1 to FB4 may include first to fourth status registers STR1 to STR4 and first to fourth flag registers FLR1 to FLR4, respectively.

An exemplary embodiment in which the third functional block FB3 is in the busy status will be described with reference to FIGS. 8A and 8B, an exemplary embodiment in which the first to fourth functional blocks FB1 to FB4 are in the idle status will be described with reference to FIGS. 9A to 9C, and an exemplary embodiment in which a status of the second functional block FB2 is changed (e.g., is changed from the idle status to the busy status) will be described with reference to FIGS. 10A and 10B.

Figure 8A:
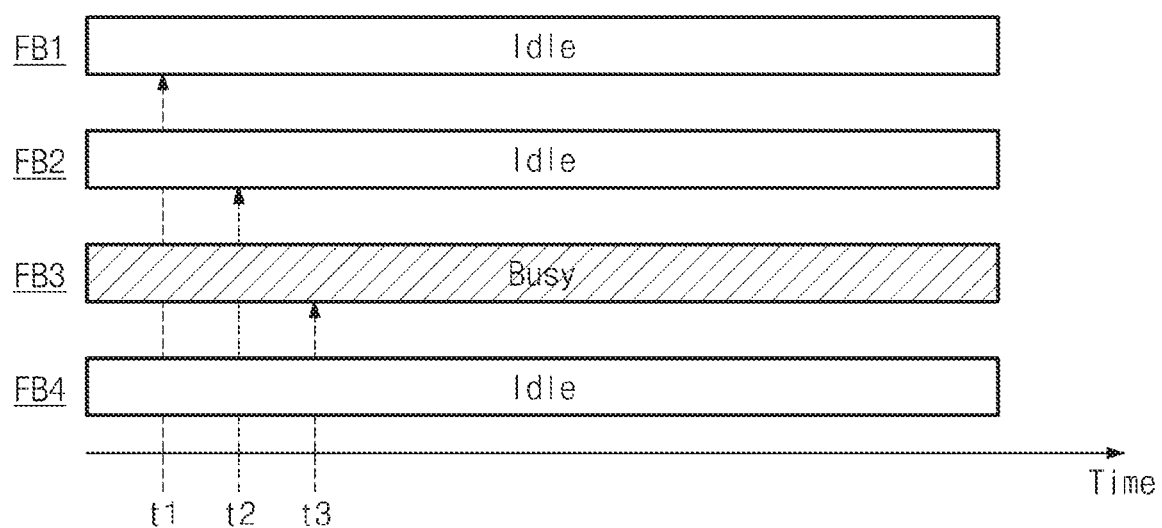
FIGS. 8A to 10B are diagrams for describing a status determining operation according to exemplary embodiments of the inventive concept.
Figure 8B:
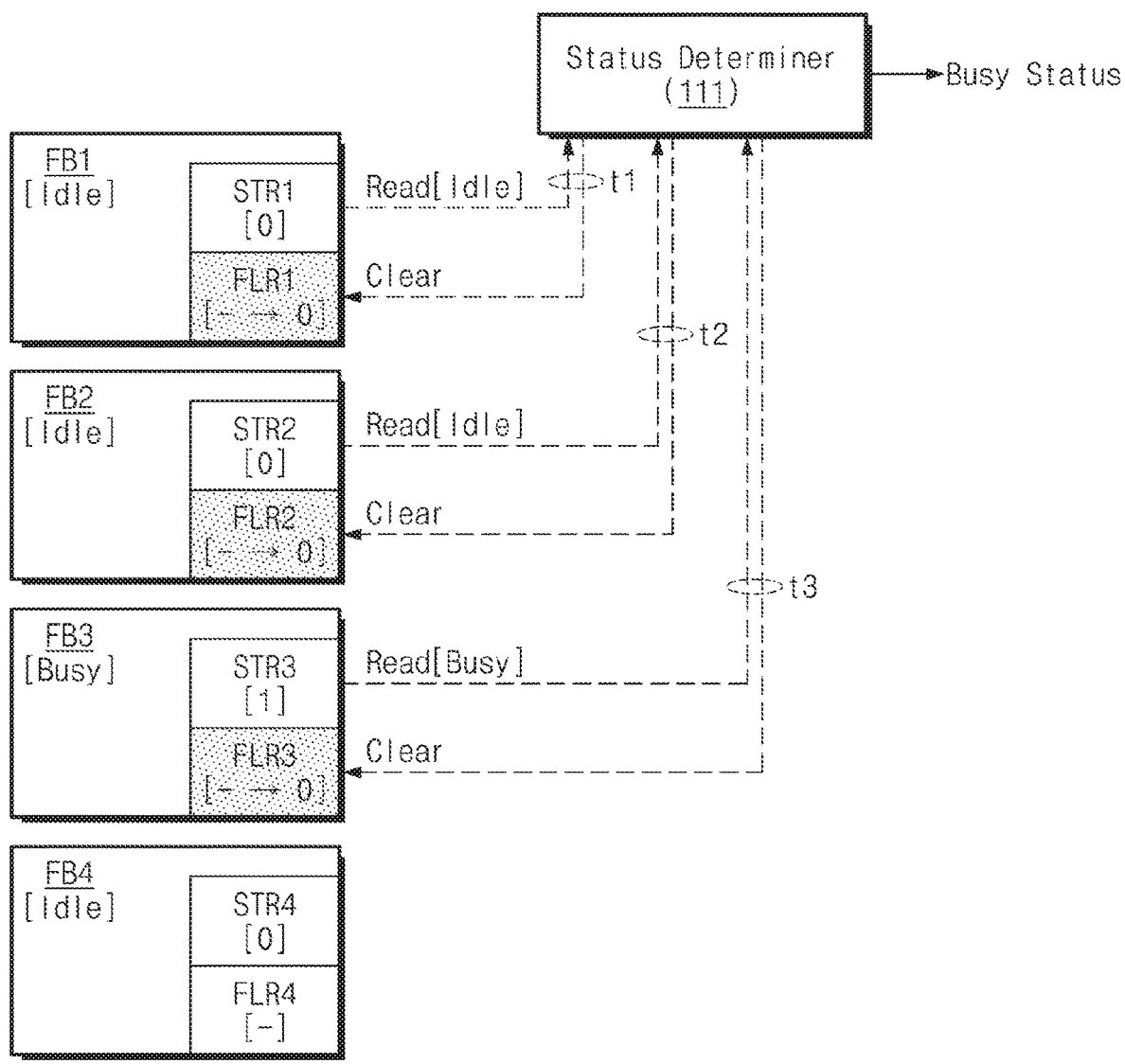

First, as illustrated in FIG. 8A, the first, second, and fourth functional blocks FB1, FB2, and FB4 may be in the idle status, and the third functional block FB3 may be in the busy status. In this case, as illustrated in FIG. 8B, the first, second, and fourth status registers STR1, STR2, and STR4 of the first, second, and fourth functional blocks FB1, FB2, and FB4 may have a value of "0" (e.g., a clear state), and the third status register STR3 of the third functional block FB3 may have a value of "1" (e.g., a set state).

The status determiner 111 may determine statuses of the first to fourth functional blocks FB1 to FB4 based on the method according to the flowchart of FIG. 7. First, at a first time point t1, the status determiner 111 may perform the status check operation on the first functional block FB1. For example, the status determiner 111 may read a value of the first status register STR1 of the first functional block FB1, and may clear a value of the first flag register FLR1. The status determiner 111 may determine that the first functional block FB1 is in the idle status, based on the value of the first status register STR corresponding to "0".

Afterwards, the status determiner 111 may perform the status check operation on the second functional block FB2 at a second time point t2 and may perform the status check operation on the third functional block FB3 at a third time point t3. The status check operations associated with the second and third functional blocks FB2 and FB3 are similar to the status check operation associated with the first functional block FB1, and thus, additional description will be omitted to avoid redundancy.

As described above, the third functional block FB3 may be in the busy status, and the value of the third status register STR3 may be "1". The status determiner 111 may determine that the third functional block FB3 is in the busy status, by verifying that the value of the third status register STR3 is "1". As such, the status determiner 111 may determine that a device (e.g., the controller 110 or the storage device 100 of FIG. 1) is in the busy status.

Figure 9A:
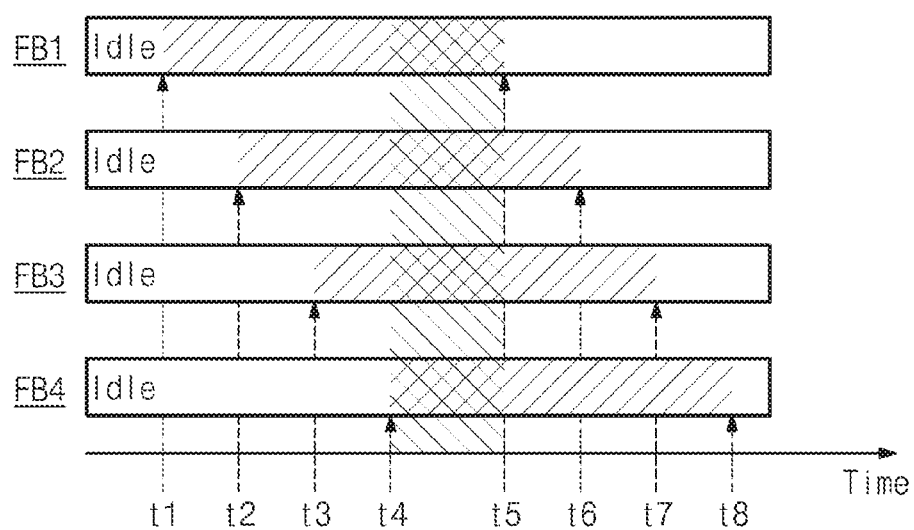
Figure 9B:
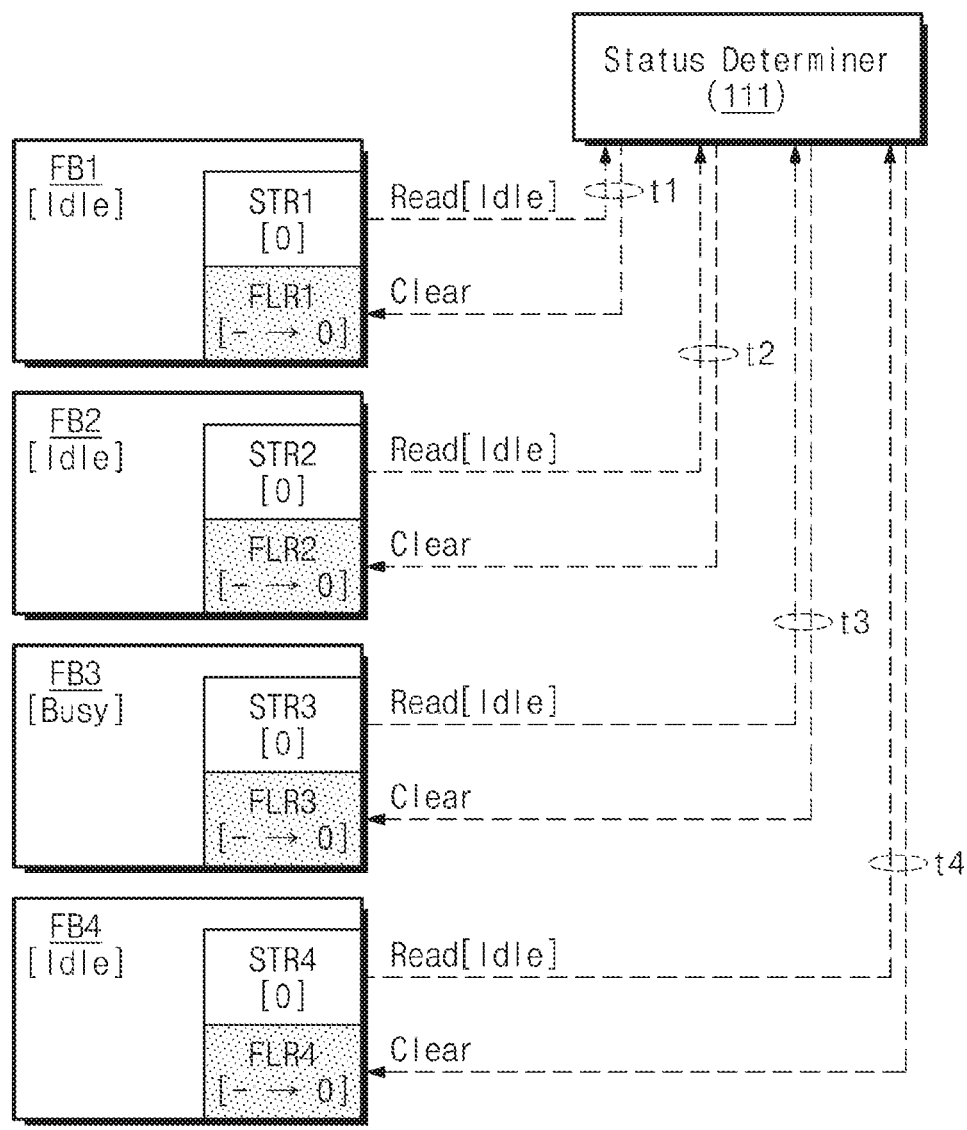
Figure 9C:
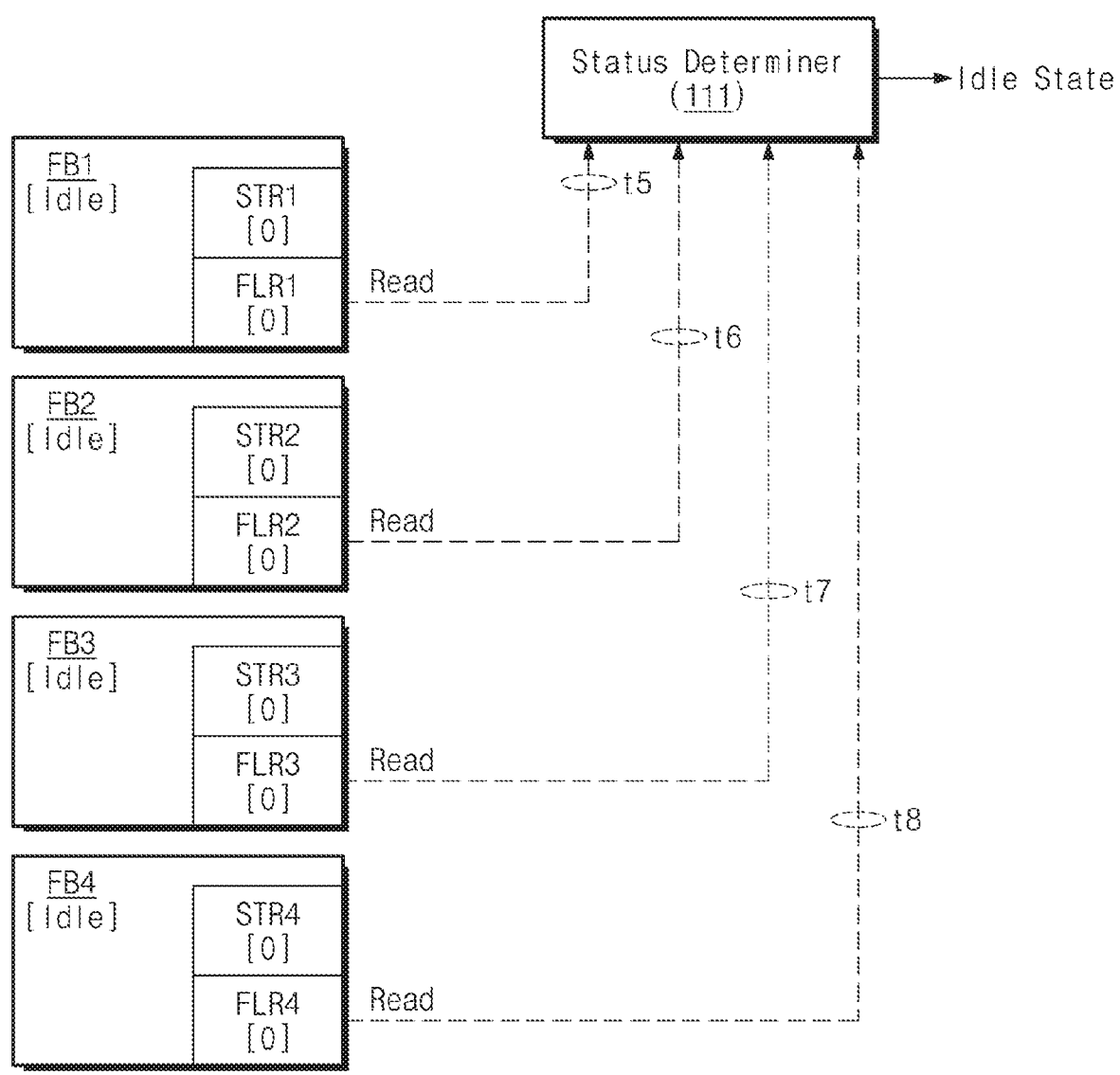

Next, referring to FIGS. 9A to 9C, all the first to fourth functional blocks FB1 to FB4 may be in the idle status. In this case, the first to fourth status registers STR1 to STR4 of the first to fourth functional blocks FB1 to FB4 may have a value of "0".

As illustrated in FIG. 9B, the status determiner 111 may respectively perform the status check operations on the first, second, third, and fourth functional blocks FB1, FB2, FB3, and FB4 at first, second, third, and fourth time points t1, t2, t3, and t4. The status check operations associated with the first to fourth functional blocks FB1 to FB4 are described above, and thus, additional descriptions will be omitted to avoid redundancy.

As illustrated in FIG. 9C, the status determiner 111 may respectively perform the status change check operations on the first, second, third, and fourth functional blocks FB1, FB2, FB3, and FB4 at fifth, sixth, seventh, and eighth time points t5, t6, t7, and t8. For example, at the fifth time point t5, the status determiner 111 may read a value of the first flag register FLR1 of the first functional block FB1. Since the first functional block FB1 maintains the idle status, the value of the first flag register FLR1 may be maintained at "0". The status determiner 111 may recognize that the first functional block FB1 maintains the idle status for a specific time, by verifying that the value of the first flag register FLR1 is "0". Likewise, the status determiner 111 may read a value of the second, third, and fourth flag registers FLR2, FLR3, and FLR4 at the sixth, seventh, and eighth time points t6, t7, and t8, and may recognize that the second, third, and fourth functional blocks FB2, FB3, and FB4 maintain the idle status for a specific time, by verifying that values of the second, third, and fourth flag registers FLR2, FLR3, and FLR4 are "0".

For example, through the operation illustrated in FIGS. 9B and 9C, the status determiner 111 may recognize that the first functional block FB1 maintains the idle status from the first time point t1 to the fifth time point t5, the second functional block FB2 maintains the idle status from the second time point t2 to the sixth time point t6, the third functional block FB3 maintains the idle status from the third time point t3 to the seventh time point t7, and the fourth functional block FB4 maintains the idle status from the fourth time point t4 to the eighth time point t8. In this case, it may be secured that all the first to fourth functional blocks FB1 to FB4 are in the idle status during a time from the fourth time point t4 to the fifth time point t5.

The status determiner 111 may determine that a device is in the idle status, by verifying that all the functional blocks are in the idle status during a specific time interval, through the operations of FIGS. 9B and 9C.

Figure 10A:
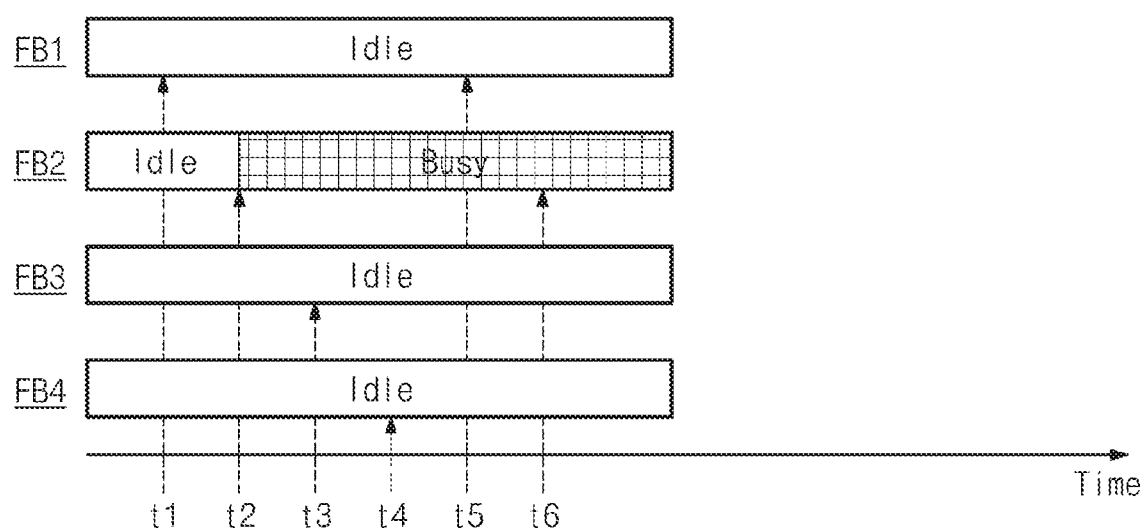
Figure 10B:
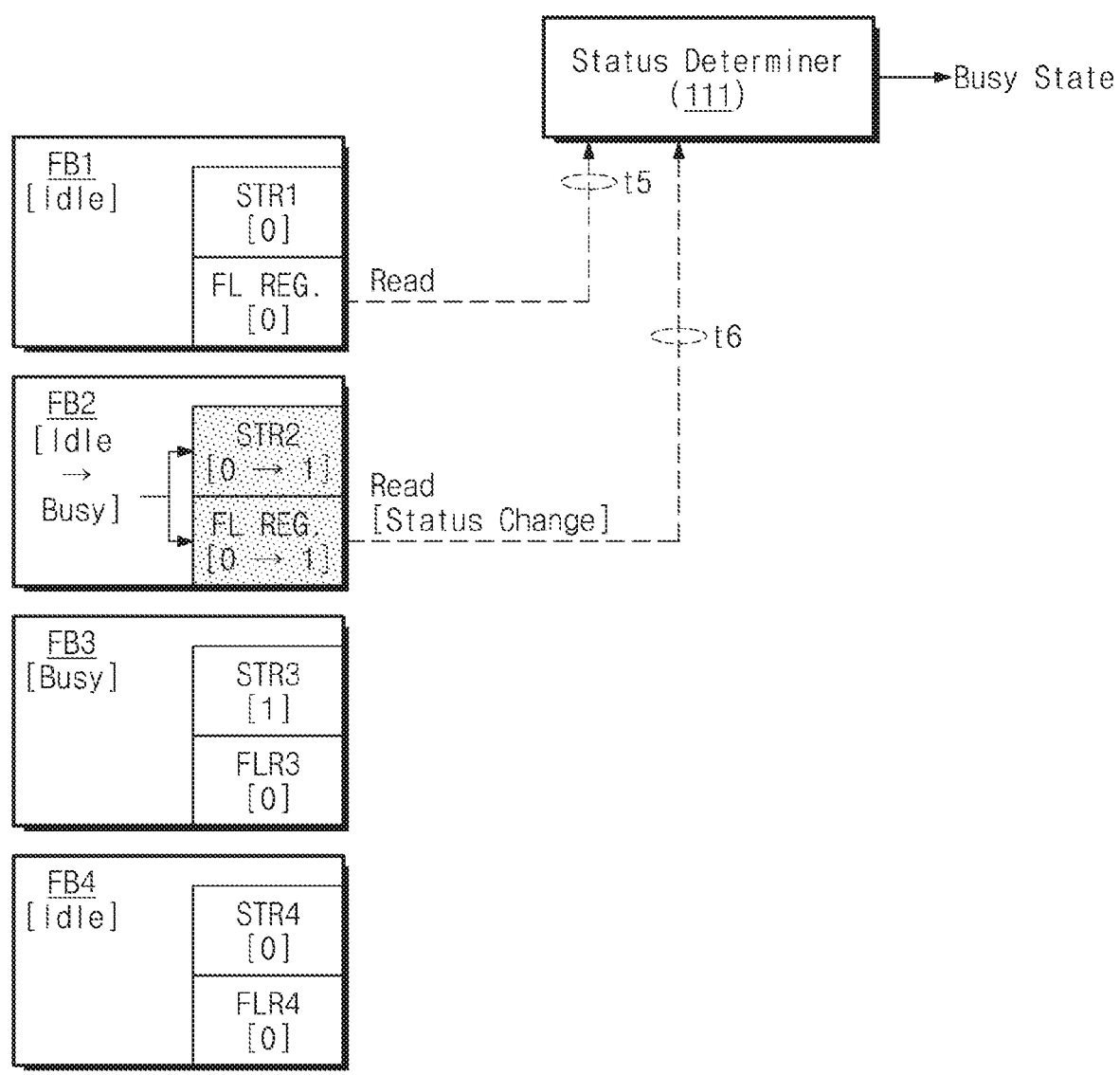

Referring to FIGS. 10A and 10B, as illustrated in FIG. 10A, the first to fourth functional blocks FB1 to FB4 may be in the idle status, and the second functional block FB2 may change from the idle status to the busy status at the second time point t2.

The status determiner 111 may respectively perform the status check operations on the first, second, third, and fourth functional blocks FB1, FB2, FB3, and FB4 at the first, second, third, and fourth time points t1, t2, t3, and t4. The status check operations associated with the first to fourth functional blocks FB1 to FB4 are similar to those described with reference to FIG. 9B, and thus, additional descriptions will be omitted to avoid redundancy.

In an exemplary embodiment of the inventive concept, as illustrated in FIG. 10A, the status of the second functional block FB2 may be changed from the idle status to the busy status at the second time point t2. In this case, the second functional block FB2 may change (e.g., set) a value of the second status register STR2 and a value of the second flag register FLR2 to "1". In an exemplary embodiment of the inventive concept, in the case where the status check operation is performed on the second functional block FB2 by the status determiner 111 at the second time point t2, the above-described operation of changing a value of the second flag register FLR2 may be performed after the status check operation associated with the second functional block FB2 is completed. This is described with reference to FIG. 7B, and thus, additional descriptions will be omitted to avoid redundancy.

As illustrated in FIG. 10B, the status determiner 111 may perform the status check operation on the first functional block FB1 at the fifth time point t5 and may perform the status check operation on the second functional block FB2 at the sixth time point t6. As described above, as the status of the second functional block FB2 is changed, a value of the second flag register FLR2 may be changed to "1". The status determiner 111 may recognize that the status of the second functional block FB2 is changed, by verifying that the value of the second flag register FLR2 is "1". In other words, the status determiner 111 may recognize that the status of the second functional block FB2 is changed from the idle status to the busy status, by verifying that the value of the second flag register FLR2 is "1". As such, the status determiner 111 may determine that a status of a device is the busy status.

As described above, a status determiner according to an exemplary embodiment of the inventive concept may determine that all functional blocks are in the idle status for a specific time, by performing a status check operation and a status change check operation for each of a plurality of functional blocks. Accordingly, statuses of the plurality of functional blocks may be determined accurately in an environment where the plurality of functional blocks operate independently of one another without intervention of any other controller or a core. Accordingly, an electronic device with improved performance and improved reliability may be provided.

Figure 11:
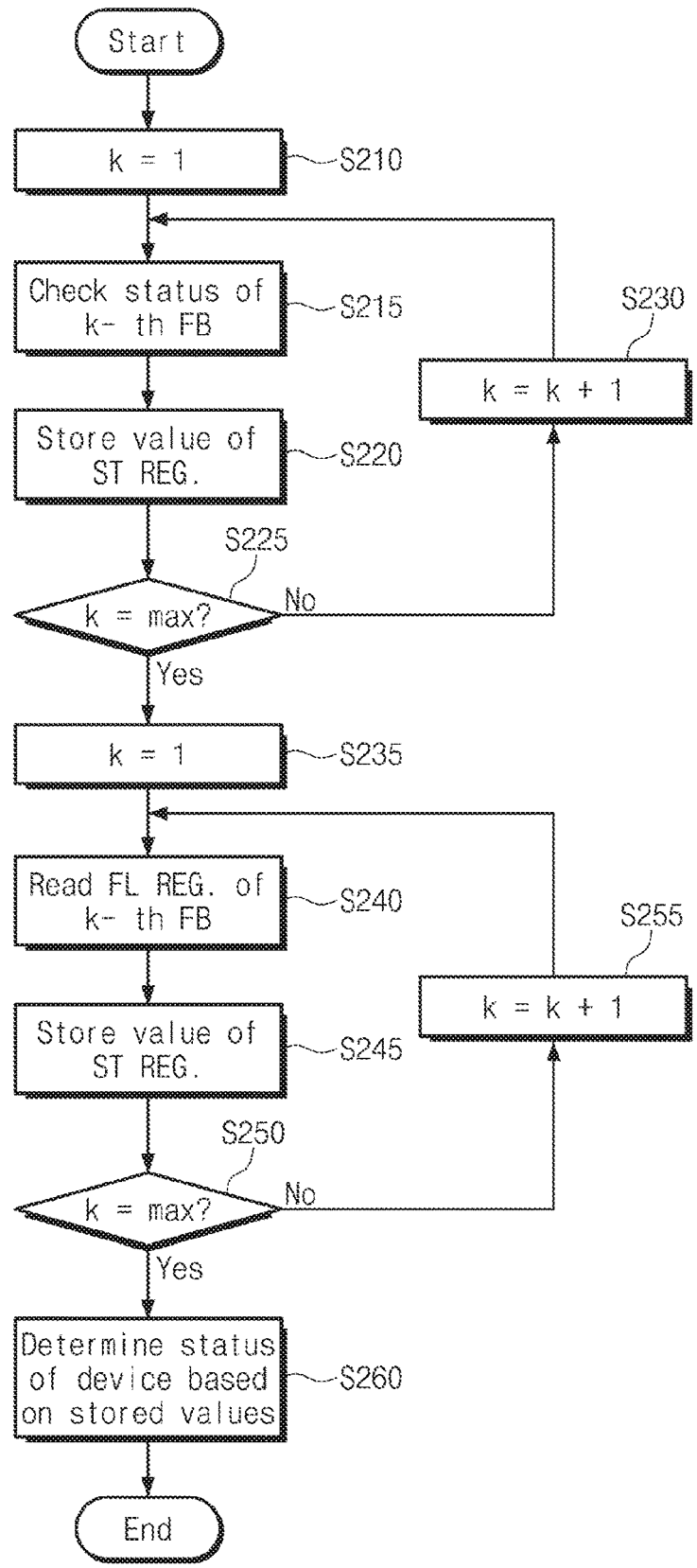
FIG. 11 is a flowchart illustrating an operation of the status determiner of FIG. 2 according to an exemplary embodiment of the inventive concept.

FIG. 11 is a flowchart illustrating an operation of the status determiner of FIG. 2 according to an exemplary embodiment of the inventive concept. Referring to FIGS. 2, 5, and 11, the status determiner 111 may perform operation S210 and operation S215. Operation S210 and operation S215 are similar to operation S110 and operation S115 of FIG. 7A, and thus, additional descriptions will be omitted to avoid redundancy.

In operation S220, the status determiner 111 may store a read value of a status register. Afterwards, the status determiner 111 may perform operation S225 and operation S230. The status determiner 111 may repeatedly perform operation S215 to operation S230 to store values of status registers of all functional blocks.

For example, in the exemplary embodiment described with reference to FIGS. 7A and 7B, in the case where the read value of the status register STR is "1", the status determiner 111 determines that a status of a device is the busy status, without performing the status check operation on the remaining functional blocks. However, in the exemplary embodiment according to FIG. 11, regardless of the read value of the status register STR, the status determiner 111 may perform the status check operation for each of all the functional blocks and may store the read value of the status register STR.

Afterwards, the status determiner 111 may perform operation S235 to operation S255. Operation S235, operation S240, operation S250, and operation S255 are similar to operation S145, operation S150, operation S160, and operation S170 of FIG. 7A, and thus, a detailed description thereof will not be repeated here.

By performing operation S235 to operation S255, the status determiner 111 may read a value of the flag register FLR of each of a plurality of functional blocks and may store the read values of the flag registers FLR. For example, in the status check operation described with reference to FIG. 7A, in the case where a value of the flag register FLR is "1" (e.g., in the case where a status of a functional block is changed), the status determiner 111 determines that a status of a device is the busy status, without performing the status change check operation on the remaining functional blocks. In contrast, according to the flowchart of FIG. 11, regardless of a value of the flag register FLR, the status determiner 111 may store and manage values of the flag registers FLR of all the functional blocks.

Afterwards, in operation S260, the status determiner 111 may finally determine a status of a device based on the stored values. For example, when the status check operations associated with the plurality of functional blocks determine that the plurality of functional blocks are in the idle status and the status change check operations associated with the plurality of functional blocks determine that statuses of the plurality of functional blocks are not changed, the status determiner 111 may determine that a device is in the idle status.

Alternatively, when the status check operations associated with the plurality of functional blocks determine that the plurality of functional blocks are in the idle status and the status change check operations associated with the plurality of functional blocks determine that statuses of the plurality of functional blocks are changed, the status determiner 111 may determine that a device is in the busy status.

Alternatively, the status check operations associated with the plurality of functional blocks determine that some of the plurality of functional blocks are in the idle status and that the remaining functional blocks are in the busy status and the status change check operations associated with the plurality of functional blocks determine that statuses of the some functional blocks are not changed and that statuses of the remaining functional blocks are changed, the status determiner 111 may determine that a device is in the idle status.

Alternatively, when the status check operations associated with the plurality of functional blocks determine that some of the plurality of functional blocks are in the idle status and that the remaining functional blocks are in the busy status and the status change check operations associated with the plurality of functional blocks determine that statuses of the some functional blocks are changed or that statuses of the remaining functional blocks are not changed, the status determiner 111 may determine that a device is in the busy status.

FIGS. 12A to 12D are diagrams for describing an operation of FIG. 11 of determining a status of a device based on stored values (operation S260) according to an exemplary embodiment of the inventive concept. An exemplary embodiment in which all the first to fourth functional blocks FB1 to FB4 maintain the idle status will be described with reference to FIG. 12A, an exemplary embodiment in which the third functional block FB3 maintains the busy status will be described with reference to FIG. 12B, an exemplary embodiment in which a status of the third functional block FB3 is changed from the busy status to the idle status will be described with reference to FIG. 12C, and an exemplary embodiment in which a status of the third functional block FB3 is changed from the idle status to the busy status will be described with reference to FIG. 12D.

Referring to FIGS. 2 and 12A to 12D, the status determiner 111 may respectively perform the status check operation on the first, second, third, and fourth functional blocks FB1, FB2, FB3, and FB4 at the first, second, third, and fourth time points t1, t2, t3, and t4 and may store values of the status registers STR thus read. Afterwards, the status determiner 111 may respectively perform the status change check operation on the first, second, third, and fourth functional blocks FB1, FB2, FB3, and FB4 at the fifth, sixth, seventh, and eighth time points t5, t6, t7, and t8 and may store values of the flag registers FLR read according to the status change check operations.

Figure 12A:
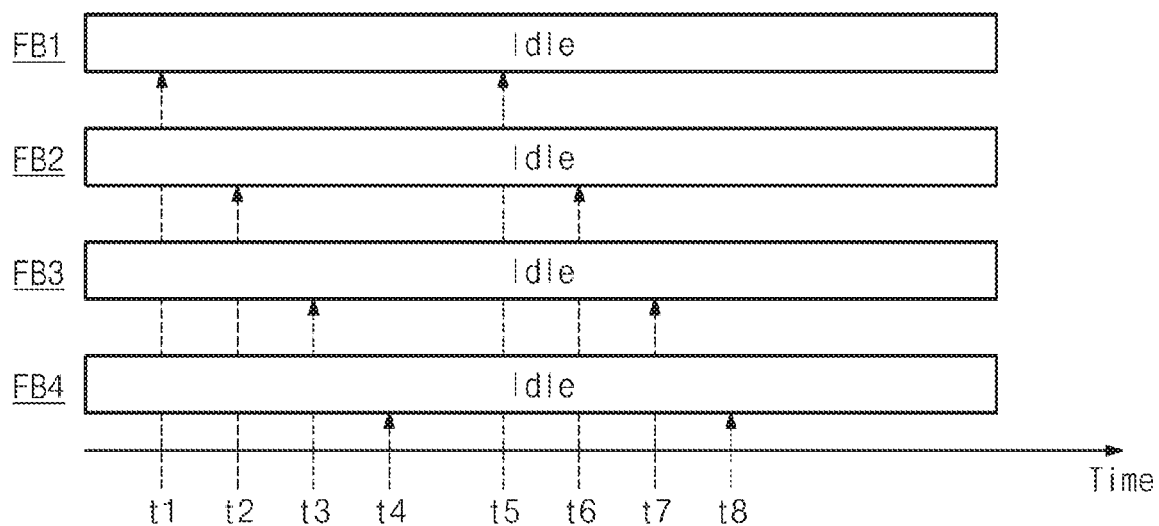
FIGS. 12A to 12D are diagrams for describing an operation of FIG. 11 of determining a status of a device based on stored values, according to an exemplary embodiment of the inventive concept.
Figure 12A:
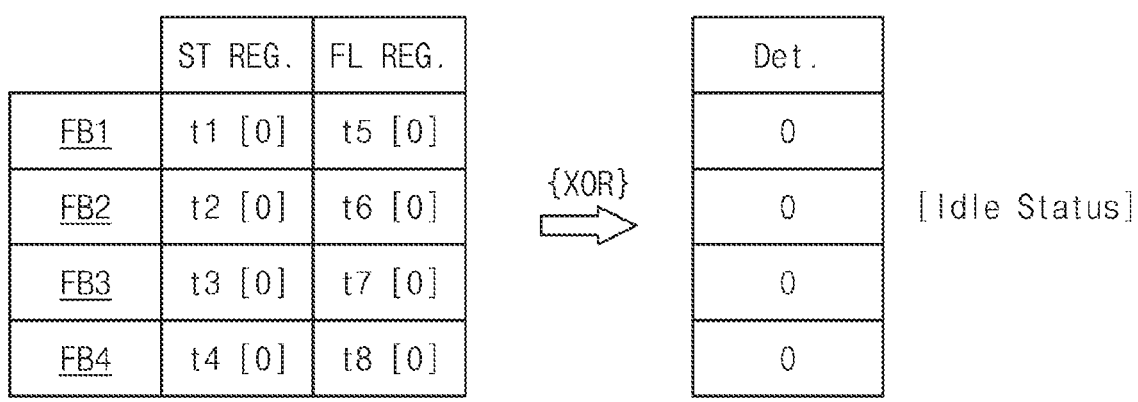

As illustrated in FIG. 12A, in the case where all the first to fourth functional blocks FB1 to FB4 maintain the idle status, the values of the status registers STR read by the status check operations and the values of the flag registers FLR read by the status change check operations may be "0". In this case, with regard to each functional block, a value obtained by performing an operation (e.g., an exclusive OR (XOR) operation) on the value of the status register STR and the value of the flag register FLR may be "0". In this case, the status determiner 111 may determine that a status of a device is the idle status.

Figure 12B:
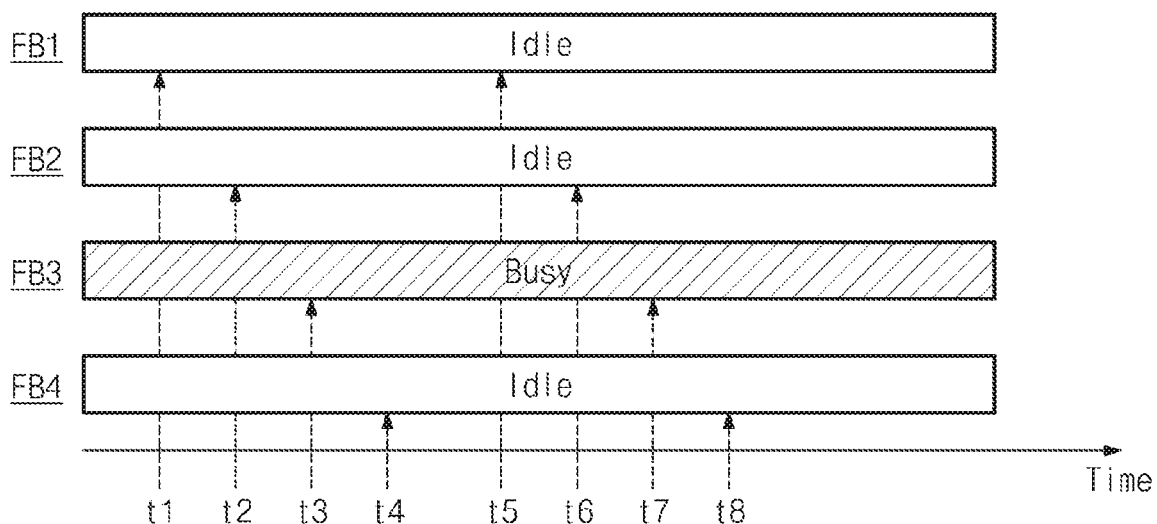
Figure 12B:
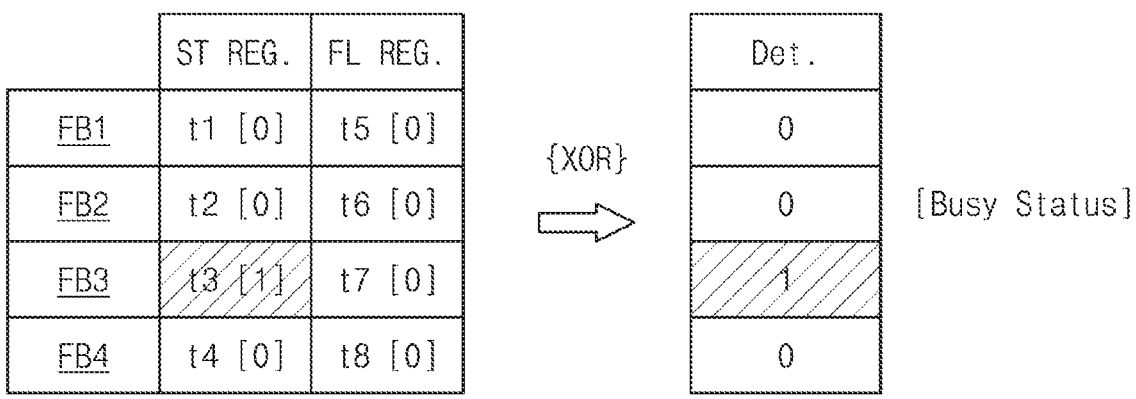

As illustrated in FIG. 12B, in the case where the first, second, and fourth functional blocks FB1, FB2, and FB4 maintain the idle status and the third functional block FB3 maintains the busy status, values of the status registers STR read through the status check operations associated with the first, second, and fourth functional blocks FB1, FB2, and FB4 may be "0", and a value of the status register STR read through the status check operation associated with the third functional block FB3 may be "1". Since each of the first to fourth functional blocks FB1 to FB4 maintains its own status (the idle status or the busy status), values of the flag registers FLR read through the status change check operations associated with the first to fourth functional blocks FB1 to FB4 may be "0". In this case, with regard to each functional block, a value obtained by performing an operation (e.g., an XOR operation) on the value of the status register STR and the value of the flag register FLR may not be "0" (e.g., at least one "1" may be included). As such, the status determiner 111 may determine that a status of a device is the busy status.

Figure 12C:
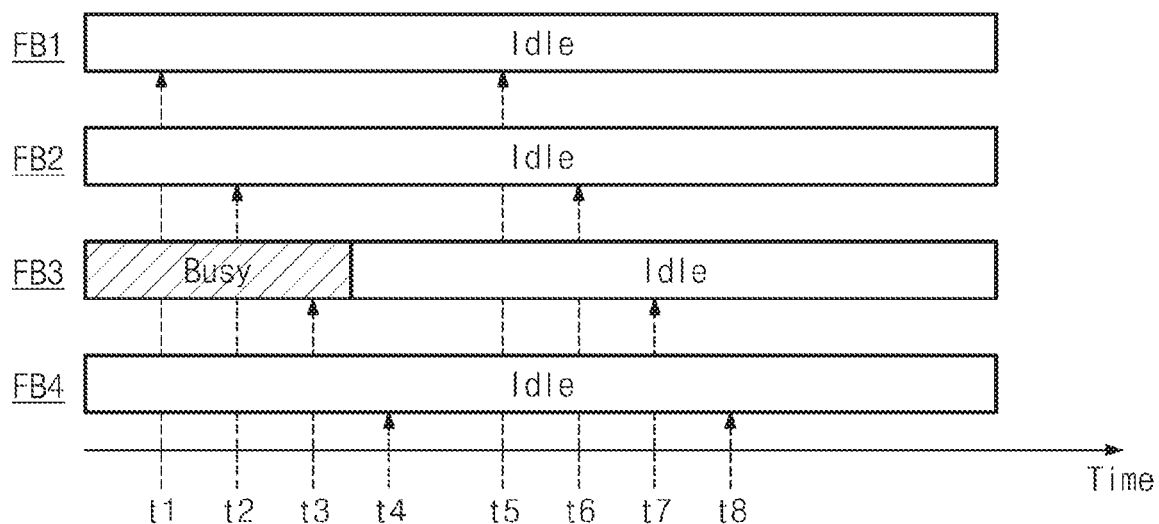
Figure 12C:
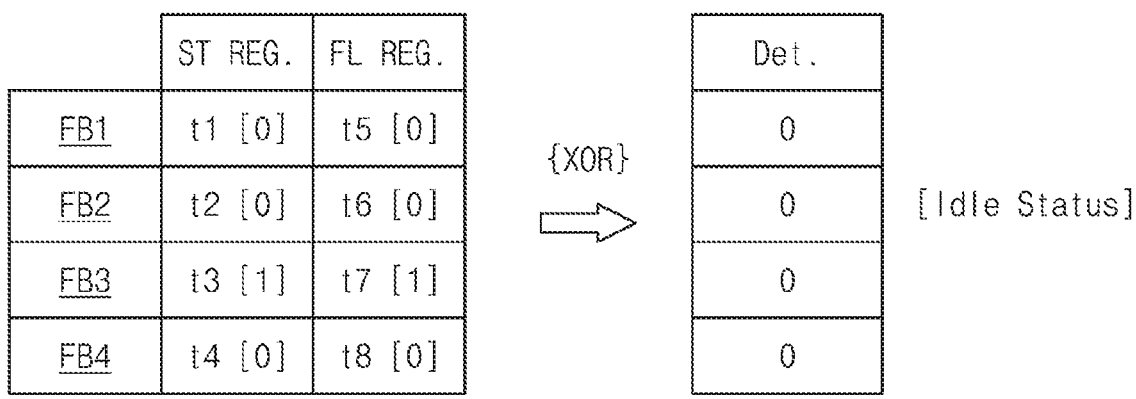

As illustrated in FIG. 12C, in the case where the first, second, and fourth functional blocks FB1, FB2, and FB4 maintain the idle status and the third functional block FB3 changes from the busy status to the idle status, values of the status registers STR read through the status check operations associated with the first, second, and fourth functional blocks FB1, FB2, and FB4 may be "0", and a value of the status register STR read through the status check operation associated with the third functional blocks FB3 may be "1". Since the first, second, and fourth functional blocks FB1, FB2, and FB4 maintain the idle status and the third functional block FB3 changes from the busy status to the idle status, values of the flag registers FLR read through the status change check operations associated with the first, second, and fourth functional blocks FB1, FB2, and FB4 may be "0", and a value of the flag register FTL read through the status change check operation associated with the third functional block FB3 may be "1". In this case, with regard to each functional block, a value obtained by performing an operation (e.g., an XOR operation) on the value of the status register STR and the value of the flag register FLR may be "0". As such, the status determiner 111 may determine that a status of a device is the idle status.

Figure 12D:
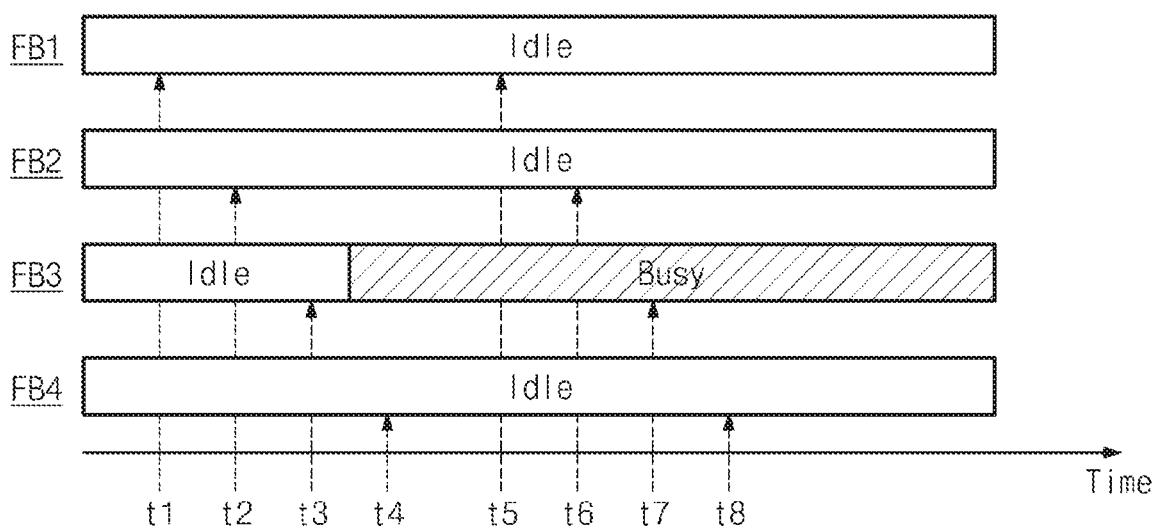
Figure 12D:
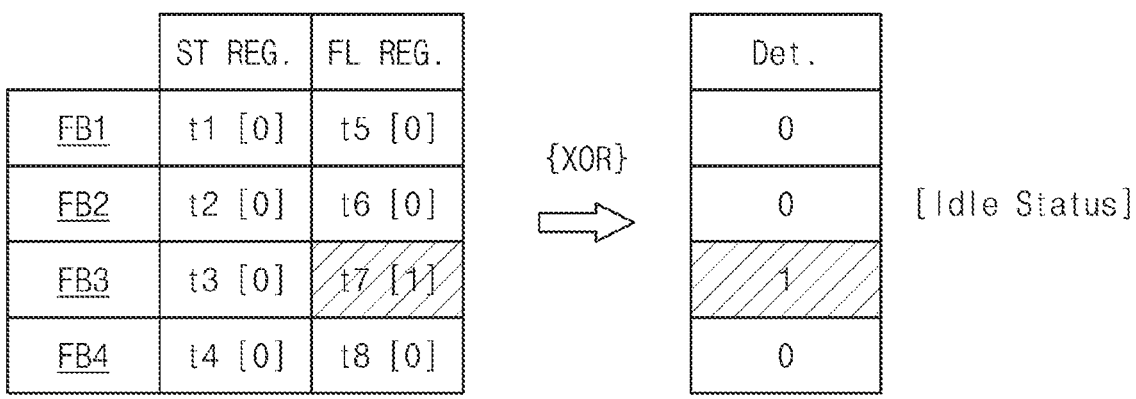

As illustrated in FIG. 12D, in the case where the first, second, and fourth functional blocks FB1, FB2, and FB4 maintain the idle status and the third functional block FB3 changes from the idle status to the busy status, values of the status registers STR read through the status check operations associated with the first to fourth functional blocks FB1 to FB4 may be "0". Since the first, second, and fourth functional blocks FB1, FB2, and FB4 maintain the idle status and the third functional block FB3 changes from the idle status to the busy status, values of the flag registers FLR read through the status change check operations associated with the first, second, and fourth functional blocks FB1, FB2, and FB4 may be "0", and a value of the flag registers FLR read through the status change check operation associated with the third functional blocks FB3 may be "1". In this case, with regard to each functional block, all values obtained by performing an operation (e.g., an XOR operation) on the value of the status register STR and the value of the flag register FLR may not be "0" (e.g., at least one "1" may be included). As such, the status determiner 111 may determine that a status of a device is the busy status.

As described above, the status determiner 111 according to an exemplary embodiment of the inventive concept may perform a status check operation and a status change check operation for each of a plurality of functional blocks and may determine whether the plurality of functional blocks are in the idle status for a specific time. Accordingly, in an environment where a plurality of functional blocks operate independently of one another, since statuses of the plurality of functional blocks are checked, reliability of a device may be improved.

Figure 13:
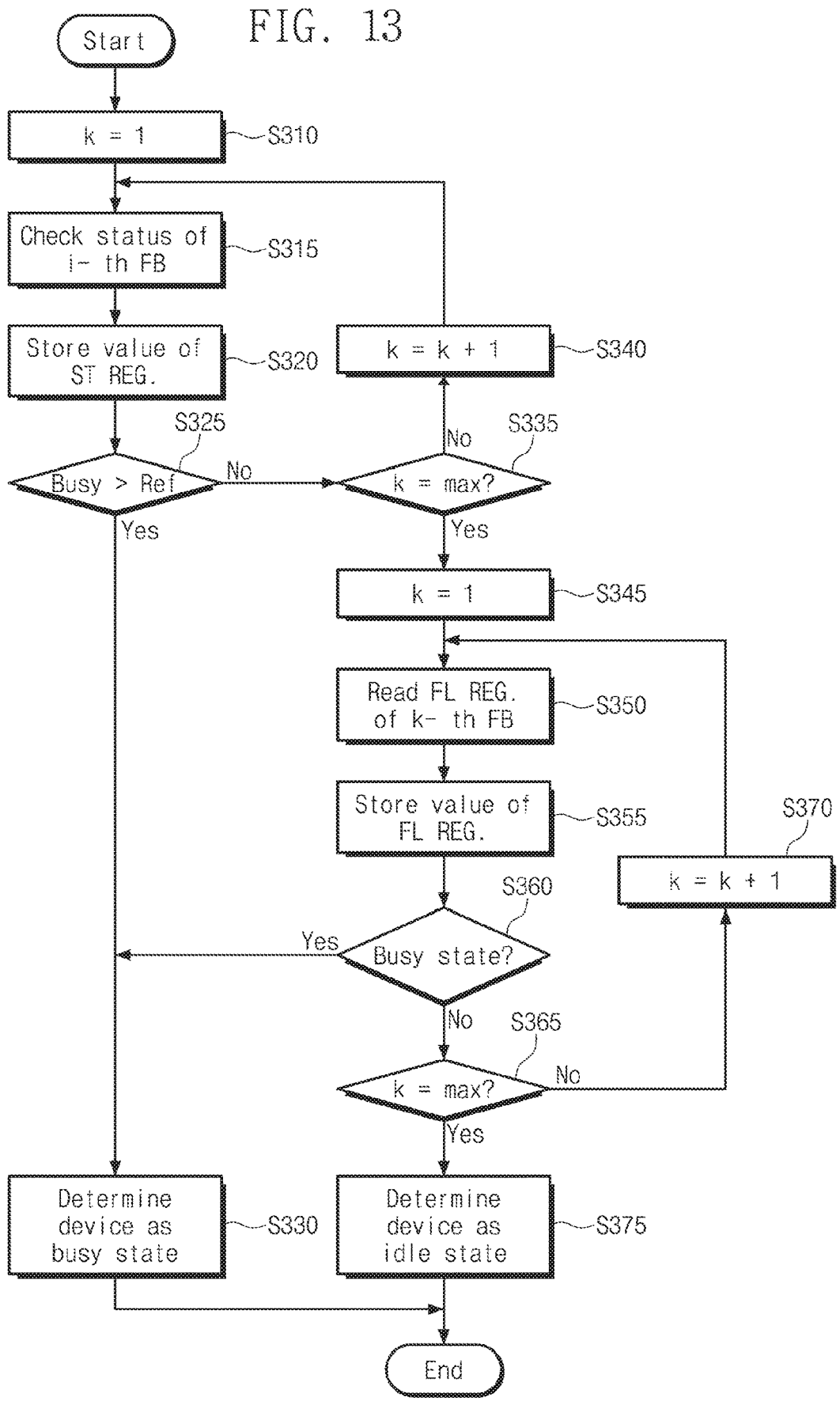
FIG. 13 is a flowchart illustrating an operation of the status determiner of FIG. 2 according to an exemplary embodiment of the inventive concept.

FIG. 13 is a flowchart illustrating an operation of the status determiner of FIG. 2 according to an exemplary embodiment of the inventive concept. Referring to FIGS. 2 and 13, the status determiner 111 may perform operation S310 to operation S340. Operation S310, operation S315, operation S320, operation S335, and operation S340 are similar to operation S210 to operation S230 of FIG. 11, and thus, additional descriptions will be omitted to avoid redundancy.

According to the flowchart of FIG. 13, after storing a value of the status register STR, the status determiner 111 may determine whether the number of busy statuses is greater than a reference value, in operation S325. For example, in the case where the status determiner 111 performs the status check operation on first to k-th functional blocks, the status determiner 111 may recognize statuses of the first to k-th functional blocks. In this case, when the number of functional blocks in the busy status, from among the first to k-th functional blocks, is greater than a reference value, in operation S330, the status determiner 111 may determine that a status of a device is the busy status, without performing the status check operation on the remaining functional blocks. In the case where the number of functional blocks in the busy status, from among the first to k-th functional blocks, is smaller than or equal to the reference value, the status determiner 111 may perform operation S335 to check statuses of the remaining functional blocks.

After the statuses of the plurality of functional blocks are completely checked, the status determiner 111 may perform operation S345 to operation S370. Operation S345, operation S350, operation S355, operation S365, and operation S370 are similar to operation S235 to operation S255 of FIG. 11, and thus, additional descriptions will be omitted to avoid redundancy.

After storing a value of the flag register FLR (e.g., after operation S355), in operation S360, the status determiner 111 may determine whether the busy status exists. For example, the status determiner 111 may recognize a status of each of the plurality of functional blocks by performing the status check operation for each of the plurality of functional blocks and may recognize whether a status of each of the plurality of functional blocks is changed, by performing the status change check operation for each of the plurality of functional blocks. A functional block which is recognized in the status check operation as being in the idle status and is recognized in the status change check operation as a status that is not changed may be finally determined as being in the idle status. Alternatively, a functional block which is recognized in the status check operation as being in the idle status and is recognized in the status change check operation as a status that is changed, or which is recognized in the status check operation as being in the busy status and is recognized in the status change check operation as a status that is not changed may be finally determined as being in the busy status. In other words, during the status change check operation, the status determiner 111 may determine whether a functional block finally determined as being in the busy status exists.

When a functional block finally determined as being in the busy status exists, in operation S330, the status determiner 111 may determine that a status of a device is the busy status, without performing the status check operation on the remaining functional blocks.

When a functional block finally determined as being in the busy status does not exist (e.g., when all functional blocks targeted for the status change check operation are in the idle status), the status determiner 111 may perform operation S365 to check whether statuses of the remaining functional blocks are changed.

When a status change check operation is completed on all the functional blocks (or when all the functional blocks are determined as being in the idle status), in operation S375, the status determiner 111 may determine that a device is in the idle status.

FIG. 14 is a block diagram illustrating an electronic device according to an exemplary embodiment of the inventive concept. Referring to FIG. 14, an electronic device 1000 may include a main core 1100, first to fourth cores 1210 to 1240, and a plurality of functional blocks FB. The plurality of functional blocks FB may be configured to independently perform some functions to be performed by the first to fourth cores 1210 to 1240.

Each of the first to fourth cores 1210 to 1240 may perform the status detection operation (or an idle check operation) on the corresponding functional block(s) of the plurality of functional blocks FB. In an exemplary embodiment of the inventive concept, each of the first to fourth cores 1210 to 1240 may determine whether the corresponding functional blocks FB maintain the idle status for a specific time, by performing the status check operation and the status change check operation on the corresponding functional blocks FB based on the method described with reference to FIGS. 1 to 13.

In an exemplary embodiment of the inventive concept, the first to fourth cores 1210 to 1240 may operate independently of the main core 1100. In other words, the main core 1100 may require a separate means for verifying statuses of the first to fourth cores 1210 to 1240. In an exemplary embodiment of the inventive concept, the main core 1100 may determine whether each of the first to fourth cores 1210 to 1240 maintains the idle status for a specific time, by performing the status check operation and the status change check operation for each of the first to fourth cores 1210 to 1240 based on the method described with reference to FIGS. 1 to 13.

In an exemplary embodiment of the inventive concept, each of the first to fourth cores 1210 to 1240 may include the status determiner 111 described with reference to FIGS. 1 to 13 for the purpose of determining statuses of the corresponding functional blocks FB. Alternatively, the main core 1100 may include the status determiner 111 described with reference to FIGS. 1 to 13 for the purpose of determining statuses of the first to fourth cores 1210 to 1240. In this case, each of the first to fourth cores 1210 to 1240 may include the status register STR indicating a status of each core and the flag register FLR indicating whether a status is changed.

According to exemplary embodiments of the inventive concept, a status determiner included in an electronic device may determine whether all functional blocks driven independently of one another maintain an idle status for a specific time. Accordingly, an overall status of the electronic device may be accurately detected, and thus, an electronic device with improved reliability and an operation method thereof are provided.

While the inventive concept has been shown and described with reference to exemplary embodiments thereof, it will be apparent to those of ordinary skill in the art that various changes and modifications in form and details may be made thereto without departing from the spirit and scope of the inventive concept as set forth in the following claims.

What is claimed is:

1. An operation method of an electronic device including a core, the operation method comprising:
   reading first status information from a first status register of a first functional block driven independently of the core;
   reading second status information from a second status register of a second functional block driven independently of the core;
   reading first change information from a first flag register of the first functional block;
   reading second change information from a second flag register of the second functional block;
   determining whether an operation status of the electronic device is any one status of an idle status and a busy status, based on the read first and second status information and the read first and second change information; and
   operating in an operation mode corresponding to the determined operation status.

2. The operation method of claim 1, further comprising:
   setting the first change information stored in the first flag register to a first value, immediately after reading the first status information; and
   setting the second change information stored in the second flag register to the first value, immediately after reading the second status information.

3. The operation method of claim 2, wherein the reading of the first status information and the setting of the first change information to the first value are atomically performed, and
   wherein the reading of the second status information and the setting of the second change information to the first value are atomically performed.

4. The operation method of claim 2, further comprising:
   locking the first status register and the first flag register immediately before reading the first status information;

unlocking the locked first status register and the locked first flag register immediately after setting the first change information to the first value;

locking the second status register and the second flag register immediately before reading the second status information; and unlocking the second status register and the second flag register immediately after setting the second change information to the first value.

5. The operation method of claim 2, wherein the first status information of the first status register is set to a second value when the first functional block is being driven, wherein the first status information of the first status register is set to the first value when the first functional block is not driven, wherein the second status information of the second status register is set to the second value when the second functional block is being driven, and wherein the second status information of the second status register is set to the second value when the second functional block is not driven.

6. The operation method of claim 5, wherein the first change information of the first flag register is set to the second value when an operation status of the first functional block is changed, and wherein the second change information of the second flag register is set to the second value when an operation status of the second functional block is changed.

7. The operation method of claim 6, wherein, when all of the read first and second change information and the read first and second status information are the first value, the operation status of the electronic device is determined as the idle status.

8. The operation method of claim 6, wherein, when the read first and second status information is the first value and at least one of the read first and second change information is the second value, the operation status of the electronic device is determined as the busy status.

9. The operation method of claim 6, wherein, when at least one of the read first and second status information is the second value, the reading of the first change information and the reading of the second change information are omitted, and the operation status of the electronic device is determined as the busy status.

10. The operation method of claim 1, wherein the electronic device is a controller configured to control a storage device, and wherein the controller operates in any one mode of a power-off mode, a power saving mode, a reset mode, or an idle mode when the determined operation status is the idle status.

11. An electronic device comprising:
a core; and
a plurality of functional blocks configured to operate independently of the core,
wherein each of the plurality of functional blocks includes:
a logic circuit configured to perform a preset function;
a status machine configured to detect an operation status of the logic circuit;
a status register configured to store status information corresponding to the operation status of the logic circuit; and
a flag register configured to store change information corresponding to a change in the operation status of the logic circuit, and
wherein the core is configured to:

perform a status check operation for each of the plurality of functional blocks based on the status information of the status register and the change information of the flag register of a corresponding one of the plurality of functional blocks;

perform a status change check operation for each of the plurality of functional blocks based on the change information of the flag register of the corresponding one of the plurality of functional blocks, after performing the status check operation;

determine operation statuses of the plurality of functional blocks based on results of the status check operation and the status change check operation; and operate in an operation mode corresponding to the determined operation statuses among a plurality of operations modes.

12. The electronic device of claim 11, wherein the core performs the status check operation for each of the plurality of functional blocks by reading the status information of the status register of the corresponding one of the plurality of functional blocks and clearing the change information of the flag register of the corresponding one of the plurality of functional blocks, and wherein the core performs the status change check operation for each of the plurality of functional blocks by reading the change information of the flag register of the corresponding one of the plurality of functional blocks.

13. The electronic device of claim 11, wherein, when the operation status of the logic circuit of a first functional block of the plurality of functional blocks is changed while the core performs the status check operation on the first functional block, the status machine of the first functional block is further configured to change the status information of the status register of the first functional block and the change information of the flag register of the first functional block after the core completes the status check operation on the first functional block.

14. The electronic device of claim 11, further comprising:
a plurality of sub-cores configured to be driven independently of the core,
wherein each of the plurality of sub-cores includes:
a core status register configured to store information about an operation status of a corresponding sub-core of the plurality of sub-cores; and
a core flag register configured to store information indicating that the operation status of the corresponding sub-core of the plurality of sub-cores is changed.

15. The electronic device of claim 14, wherein the core performs a core status check operation for each of the plurality of sub-cores by reading the information of the core status register of a corresponding one of the plurality of sub-cores and clearing the information of the core flag register of the corresponding one of the plurality of sub-cores, wherein the core performs a core status change check operation for each of the plurality of sub-cores by reading the information of the core flag register of the corresponding one of the plurality of sub-cores after performing the core status check operation on the corresponding one of the plurality of sub-cores, and wherein the core determines the operation status of each of the plurality of sub-cores based on a result of the core status check operation and a result of the core status change check operation.

16. The electronic device of claim 11, wherein the electronic device is a controller configured to control a storage device, and wherein the core operates in any one mode of a power-off mode, a power saving mode, a reset mode, or an idle mode when the determined operation statuses of the plurality of functional blocks indicate an idle status.

17. An operation method of an electronic device which includes a core and a plurality of functional blocks configured to be driven independently of the core, the operation method comprising:

performing a status check operation for each of the plurality of functional blocks;

performing a status change check operation for each of the plurality of functional blocks, when a result of the status check operation indicates that the plurality of functional blocks are in an idle status; and determining an operation status of the electronic device as the idle status and operating in a corresponding operation mode, when a result of the status change check operation indicates that operation statuses of the plurality of functional blocks are not changed.

18. The operation method of claim 17, wherein the status check operation is performed by reading a status register included in each of the plurality of functional blocks and clearing a flag register included in each of the plurality of functional blocks, and wherein the status change check operation is performed by reading the flag register included in each of the plurality of functional blocks.

19. The operation method of claim 18, wherein the status check operation is atomically performed with respect to the plurality of functional blocks.

20. The operation method of claim 17, wherein the electronic device is a controller configured to control a storage device, and wherein the core operates in any one mode of a power-off mode, a power saving mode, a reset mode, or an idle mode when the determined operation status of the electronic device indicate the idle status.

* * * * *